(12) United States Patent
Kim

(10) Patent No.: US 12,713,769 B2
(45) Date of Patent: Aug. 18, 2026

(54) DISPLAY DEVICE

(71) Applicant: LG Display Co., Ltd., Seoul (KR)

(72) Inventor: DongYoon Kim, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 441 days.

(21) Appl. No.: 18/466,455

(22) Filed: Sep. 13, 2023

(65) Prior Publication Data

US 2024/0224593 A1 Jul. 4, 2024

(30) Foreign Application Priority Data

Dec. 30, 2022 (KR) ........................ 10-2022-0191135

(51) Int. Cl.

*H10K 59/121* (2023.01)
*H10K 59/131* (2023.01)
*H10K 59/80* (2023.01)

(52) U.S. Cl.

CPC ....... *H10K 59/1213* (2023.02); *H10K 59/131* (2023.02); *H10K 59/8722* (2023.02)

(58) Field of Classification Search

CPC ............. H10K 59/1213; H10K 59/131; H10K 59/8722; H10K 59/87; H10K 59/12; H10K 59/872; H10K 59/873; H10K 59/127; H10K 59/124; H10K 50/8426; H10K 50/844; H10K 77/111; H10K 2102/311

See application file for complete search history.

(56) References Cited

U.S. PATENT DOCUMENTS 7,316,756 B2 1/2008 Boroson
7,968,382 B2 6/2011 Jinbo et al.
8,994,060 B2 3/2015 Jinbo et al.
9,065,072 B2 6/2015 Song et al.
9,070,650 B2 6/2015 Lee et al.
9,111,885 B2 8/2015 Burroughes et al.

(Continued)

FOREIGN PATENT DOCUMENTS

CN 100514704 C 7/2009
CN 101926006 A 12/2010

(Continued)

OTHER PUBLICATIONS

Taiwan Intellectual Property Office, Office Action, Taiwanese Patent Application No. 112141363, Sep. 25, 2024, 13 pages.

(Continued)

*Primary Examiner* — Anne M Hines
*Assistant Examiner* — Jose M Diaz
(74) *Attorney, Agent, or Firm* — Fenwick & West LLP

(57) ABSTRACT

A display device includes a first substrate, an inorganic layer disposed on the first substrate, a planarization layer disposed on the inorganic layer, a second substrate disposed on the planarization layer and has an end that is inset from an end of the first substrate such that the end of the first substrate extends past the end of the second substrate, a seal member covering a portion of the second substrate, an adhesive layer that is spaced apart from the seal member and on the second substrate, and a back cover on the adhesive layer and is bonded to the second substrate by the adhesive layer. Accordingly, bubbles generated due to the step difference between the seal member and the second substrate are blocked to reduce the crack generated in the inorganic layer.

15 Claims, 16 Drawing Sheets

(56) References Cited

U.S. PATENT DOCUMENTS

| | | | |
|---|---|---|---|
| 9,184,221 B2 | 11/2015 | Jinbo et al. | |
| 9,917,279 B2 | 3/2018 | Song et al. | |
| 10,068,954 B2 | 9/2018 | Kim | |
| 10,971,696 B2 | 4/2021 | Kim et al. | |
| 11,099,608 B2 | 8/2021 | Kim | |
| 11,763,701 B2 | 9/2023 | Song et al. | |
| 2006/0022592 A1 | 2/2006 | Boroson | |
| 2009/0004772 A1 | 1/2009 | Jinbo et al. | |
| 2011/0042656 A1 | 2/2011 | Burroughes et al. | |
| 2011/0248291 A1 | 10/2011 | Jinbo et al. | |
| 2013/0127472 A1 | 5/2013 | Lee et al. | |
| 2014/0048780 A1 | 2/2014 | Song et al. | |
| 2015/0249229 A1 | 9/2015 | Song et al. | |
| 2015/0270321 A1 | 9/2015 | Jinbo et al. | |
| 2017/0170247 A1 | 6/2017 | Kim | |
| 2017/0345880 A1 | 11/2017 | Kim | |
| 2020/0203642 A1* | 6/2020 | Kim | H10K 59/87 |
| 2020/0212132 A1 | 7/2020 | Kim et al. | |
| 2021/0004056 A1 | 1/2021 | Kim | |
| 2021/0150946 A1 | 5/2021 | Song et al. | |
| 2021/0204416 A1 | 7/2021 | Ahn et al. | |
| 2022/0037625 A1 | 2/2022 | Song et al. | |
| 2022/0149320 A1 | 5/2022 | Yang et al. | |
| 2022/0327296 A1* | 10/2022 | Nakano | B32B 3/08 |

FOREIGN PATENT DOCUMENTS

| | | |
|---|---|---|
| CN | 111354266 A | 6/2020 |
| CN | 112820193 A | 5/2021 |
| CN | 114068638 A | 2/2022 |
| JP | 2006-252837 A | 9/2006 |
| JP | 2008-211191 A | 9/2008 |
| KR | 10-2017-0070495 A | 6/2017 |
| KR | 10-1848884 B1 | 4/2018 |
| KR | 10-1970361 B1 | 4/2019 |
| KR | 10-2021-0004072 A | 1/2021 |
| KR | 10-2021-0084867 A | 7/2021 |
| KR | 10-2022-0061416 A | 5/2022 |

OTHER PUBLICATIONS

The Japan Patent Office, Office Action, Japanese Patent Application No. 2023-195569, Jul. 4, 2024, 13 pages.

* cited by examiner

DISPLAY DEVICE

CROSS-REFERENCE TO RELATED APPLICATION

This application claims the priority of Republic of Korea Patent Application No. 10-2022-0191135 filed on Dec. 30, 2022, in the Korean Intellectual Property Office, which is hereby incorporated by reference in its entirety.

BACKGROUND

Field

The present disclosure relates to a display device, and more particularly, to a display device which does not use a plastic substrate to improve the moisture permeation characteristic and reduces a crack of an inorganic layer to improve the rigidity.

Description of the Related Art

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is folded or rolled is getting attention as a next generation display device.

SUMMARY

An object to be achieved by the present disclosure is to provide a display device which uses one of a transparent conducting oxide layer and an oxide semiconductor layer as a substrate, instead of a plastic substrate to improve the moisture permeation characteristic.

Another object to be achieved by the present disclosure is to provide a display device which reduces bubbles generated in an outer portion of the display device.

Still another object to be achieved by the present disclosure is to provide a display device in which the crack of the inorganic layer generated at an outer portion of the display device is reduced to improve the rigidity.

Still another object to be achieved by the present disclosure is to provide a display device with an improved rigidity of the outer portion of the display device.

Objects of the present disclosure are not limited to the above-mentioned objects, and other objects, which are not mentioned above, can be clearly understood by those skilled in the art from the following descriptions.

In one embodiment, a display device comprises: a first substrate including an active area having a plurality of sub pixels in the active area and a non-active area enclosing the active area, the first substrate comprising one of a transparent conducting oxide or an oxide semiconductor; an inorganic layer on the first substrate; a planarization layer on the inorganic layer; a second substrate on the planarization layer, the second substrate including an end that is inset from an end of the first substrate such that the end of the first substrate extends past the end of the second substrate; a seal member covering a portion of the second substrate; an adhesive layer on the second substrate, the adhesive layer spaced apart from the seal member; and a back cover on the adhesive layer, the back cover bonded to the second substrate by the adhesive layer. Accordingly, a moisture permeation characteristic of the display device is improved and the crack generation of the inorganic layer may be reduced in the outer area.

In one embodiment, a display device comprises: a first substrate comprising one of a transparent conducting oxide or an oxide semiconductor, the first substrate having an active area and a non-active area around the active area; an inorganic layer on the active area and the non-active area of the first substrate; a plurality of subpixels on a portion of the inorganic layer in the active area, the plurality of subpixels configured to emit light; and a second substrate on the plurality of subpixels, the second substrate including an end that is inset from an end of the first substrate in the non-active area such that the end of the first substrate extends past the end of the second substrate in the non-active area.

In one embodiment, a display device comprises: a first substrate comprising an active area and a non-active area around the active area; an inorganic layer on the active area and the non-active area of the first substrate; a plurality of subpixels on a portion of the inorganic layer in the active area, the plurality of subpixels configured to emit light; a second substrate on the plurality of subpixels, the second substrate including an end that is inset from an end of the first substrate in the non-active area such that the end of the first substrate extends past the end of the second substrate in the non-active area; a seal member in the non-active area, the seal member covering an edge of an uppermost surface of the second substrate in the non-active area such that an uppermost portion of the seal member is higher than the uppermost surface of the second substrate; a back cover on the second substrate; and an adhesive layer between the second substrate and the back cover, an end of the adhesive layer spaced apart from the seal member in the non-active area.

Other detailed matters of the exemplary embodiments are included in the detailed description and the drawings.

According to the present disclosure, a transparent conductive oxide layer and an oxide semiconductor layer are used as a substrate of the display device to easily control a moisture permeability and improve a flexibility.

According to the present disclosure, a position of disposing an adhesive layer which bonds the display panel and the back cover is adjusted to reduce bubbles to be generated in the outer portion.

According to the present disclosure, the bubbles to be generated are minimized to reduce a crack which may be generated in an inorganic layer and a wiring line at the outer portion, thereby improving the reliability of the display device.

According to the present disclosure, an adhesive layer which bonds the display panel and the back cover is disposed to be spaced apart from a seal member to fully cover the inorganic layer of the display device, thereby improving the rigidity of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
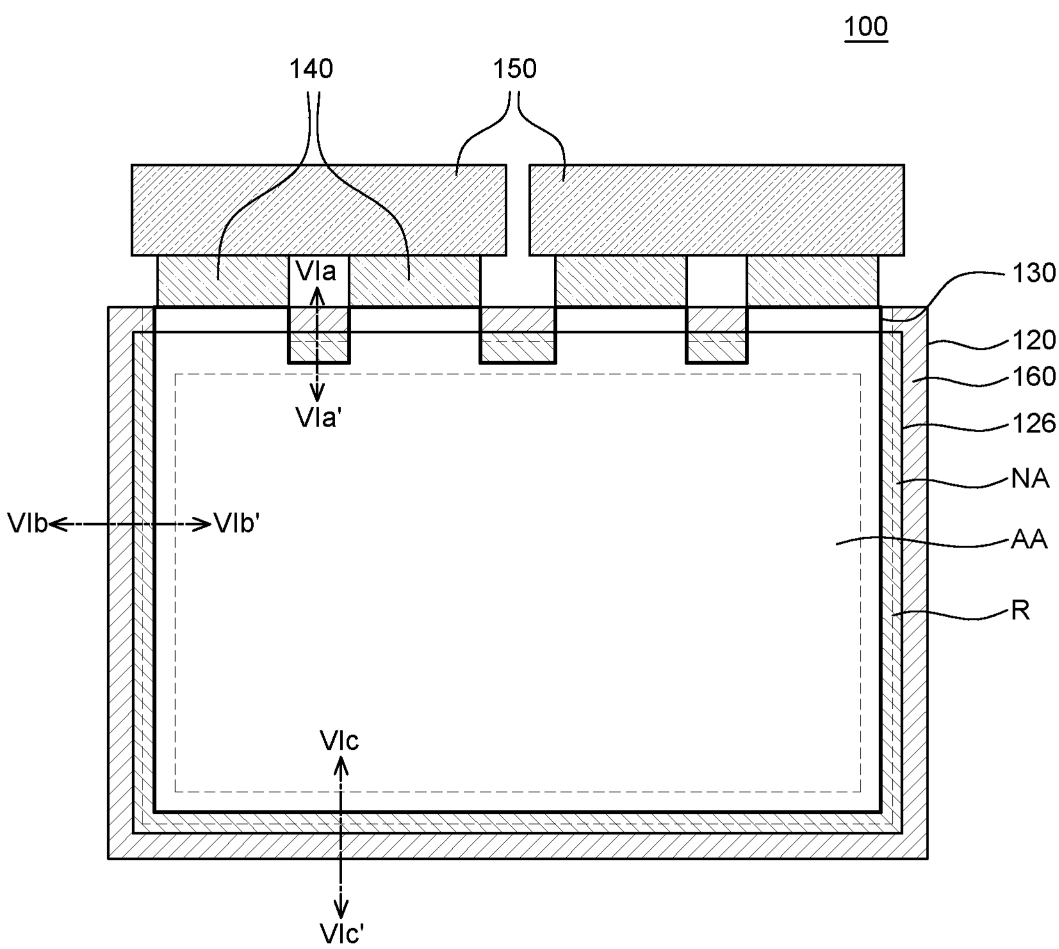
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “comprising” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on”, “above”, “below”, and “next”, one or more parts may be positioned between the two parts unless the terms are used with the term “immediately” or “directly”.

When an element or layer is disposed “on” another element or layer, another layer or another element may be interposed directly on the other element or therebetween.

Although the terms “first”, “second”, and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Figure 2:
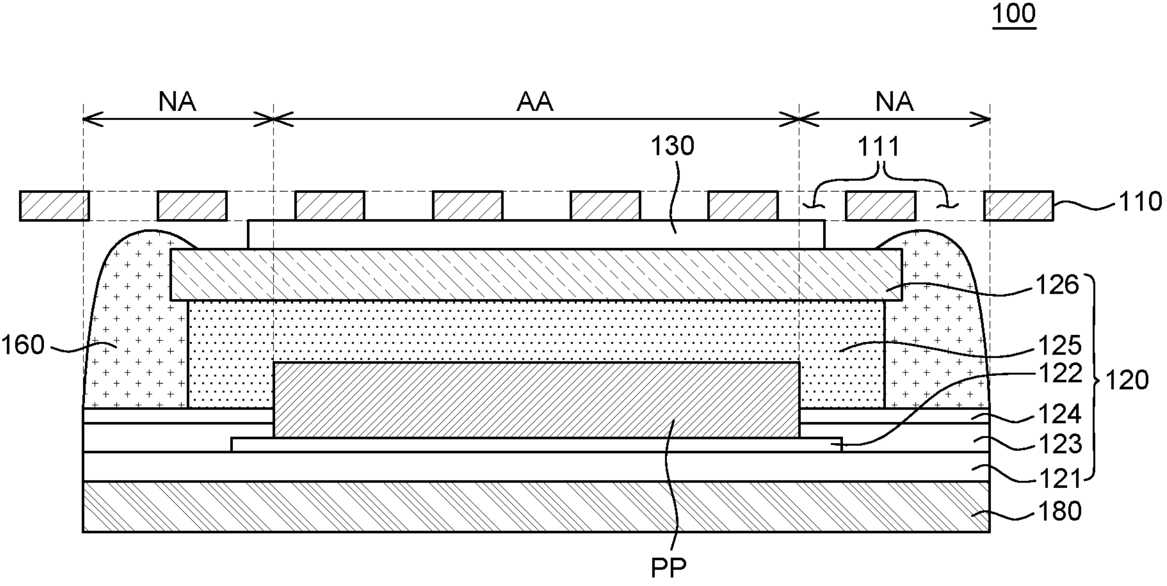
FIG. 2 is a schematic cross-sectional view of a display device according to an exemplary embodiment of the present disclosure.

FIG. 1 is a plan view of a display device according to an exemplary embodiment of the present disclosure. FIG. 2 is a schematic cross-sectional view of a display device according to an exemplary embodiment of the present disclosure. For the convenience of description, in FIG. 1, among various components of the display device 100, a display panel 120, a plurality of flexible films 140, a plurality of printed circuit boards 150, and a seal member 160 are illustrated. The display device 100 may have other components than shown in the drawings.

Referring to FIGS. 1 and 2, a back cover 110 is disposed on one surface of the display panel 120 to support the display panel 120. The back cover 110 may be formed to be larger than the display panel 120 in a plane and thus protect the other configurations of the display device 100 from the outside.

Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar or plastic. However, if the material of the back cover 110 satisfies physical conditions such as a thermal strain amount, a radius of curvature, and a rigidity, the material may be diversely changed depending on the design, and is not limited thereto. Even though in the exemplary embodiment of the present disclosure, the entire back cover 110 is integrally formed, it is not limited thereto so that when the display device 100 is rolled or folded, a plurality of back covers may be formed so as to correspond thereto.

Referring to FIG. 2, the back cover 110 includes a plurality of openings 111. When the display panel 120 is wound or unwound, the plurality of openings 111 of the back cover 110 may be deformed by a stress which is applied to the display panel 120. Specifically, when the display panel 120 is wound or unwound, the back cover 110 may be deformed as the plurality of openings 111 contracts or expands. Further, as the plurality of openings 111 contracts or expands, a slip phenomenon of the display panel 120 disposed on the back cover 110 may be reduced so that the stress which is applied to the display panel 120 may be reduced.

In the display panel 120, a plurality of sub pixels including a light emitting diode for displaying an image is disposed. Such a display panel may be a flexible display panel 120 to be wound around or unwound from the roller.

The display panel 120 includes an active area AA and a non-active area NA.

The active area AA is an area where images are displayed. In the active area AA, a pixel unit PP configured by a plurality of sub pixels may be disposed to display images. For example, the pixel unit PP is configured by a plurality of sub pixels including a light emitting diode and a driving circuit to display images.

The non-active area NA is an area where no image is displayed and various wiring lines and driving integrated circuits (ICs) for driving the sub pixels disposed in the active area AA are disposed. For example, in the non-active area NA, various driving ICs, such as a gate driver IC and a data driver IC, may be disposed.

Referring to FIG. 2, the display panel 120 includes a first substrate 121, an inorganic layer 122, a planarization layer 123, a bank 124, a pixel unit PP, an adhesive layer 125, and a second substrate 126.

The first substrate 121 is a supporting member which supports various components of the display panel 120. The first substrate 121 may be formed of any one of a transparent conducting oxide and an oxide semiconductor. For example, the first substrate 121 may be formed of a transparent conducting oxide (TCO), such as indium tin oxide (ITO), indium zinc oxide (IZO), or indium tin zinc oxide (ITZO).

Further, the first substrate 121 may be formed of an oxide semiconductor material formed of indium (In) and gallium (Ga), for example, a transparent oxide semiconductor such as indium gallium zinc oxide (IGZO), indium gallium oxide (IGO), and indium tin zinc oxide (ITZO). However, a type of a material of the transparent conducting oxide and the oxide semiconductor is illustrative so that the first substrate 121 may be formed by another transparent conducting oxide and oxide semiconductor material which have not been described in the specification, but is not limited thereto.

In the meantime, the first substrate 121 may be formed by depositing the transparent conducting oxide or an oxide semiconductor with a very thin thickness compared to conventional plastic substrates. Therefore, as the first substrate 121 is formed to have a very thin thickness, the substrate may have a flexibility. A display device 121 including the first substrate 101 having a flexibility may be implemented as a flexible display device 100 which may display an image even in a folded or rolled state. For example, when the display device 100 is a foldable display device, the first substrate 121 may be folded or unfolded with respect to a folding axis. As another example, when the display device 100 is a rollable display device, the display device may be stored by being rolled around the roller. Accordingly, the display device 100 according to the exemplary embodiment of the present disclosure uses a first substrate 121 having a flexibility to be implemented as a flexible display device 100 like a foldable display device or a rollable display device.

Further, the display device 100 according to the exemplary embodiment of the present disclosure uses a first substrate 121 formed of a transparent conducting oxide or an oxide semiconductor to perform a laser lift off (LLO) process. The LLO process refers to a process of separating a temporary substrate below the first substrate 101 and the first substrate 121 using laser during the manufacturing process of a display device 121. Accordingly, the first substrate 121 is a layer for more easily performing the LLO process so that it may be referred to as a functional thin film, a functional thin film layer, or a functional substrate.

The first substrate 121 includes an active area AA and a non-active area NA.

The active area AA is an area where images are displayed. In the active area AA, a pixel unit PP configured by a plurality of sub pixels may be disposed to display images. For example, the pixel unit PP is configured by a plurality of sub pixels including a light emitting diode and a driving circuit to display images.

The non-active area NA is an area where no image is displayed and various wiring lines and driving ICs for driving the sub pixels disposed in the active area AA are disposed. For example, in the non-active area NA, various driving ICs, such as a gate driver IC and a data driver IC, may be disposed.

The plurality of flexible films 140 is disposed at one end of the first substrate 121. The plurality of flexible films 140 is electrically connected to one end of the first substrate 121. The plurality of flexible films 140 is films in which various components are disposed on a base film having flexibility to supply a signal to the plurality of sub pixels of the active area AA. First ends of the plurality of flexible films 140 are disposed in the non-active area NA of the first substrate 121 to supply a data voltage to the plurality of sub pixels of the active area AA. In the meantime, even though four flexible films 140 are illustrated in FIG. 1, the number of flexible films 140 may vary depending on the design, but is not limited thereto.

In the meantime, a driving IC such as a gate driver IC or a data driver IC may be disposed on the plurality of flexible films 140. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 140 by a chip on film manner, but is not limited thereto.

The printed circuit board 150 is connected to the plurality of flexible films 140. The printed circuit board 150 is a component which supplies signals to the driving IC. Various components may be disposed in the printed circuit board 150 to supply various driving signals such as a driving signal or a data voltage to the driving IC. In the meantime, even though two printed circuit boards 150 are illustrated in FIG. 1, the number of printed circuit boards 150 may vary depending on the design and is not limited thereto.

Referring to FIG. 2, an inorganic layer 122 is disposed on the first substrate 121. The inorganic layer 122 may comprise a plurality of inorganic layers including a lower buffer layer 122*a*, an upper buffer layer 122*b*, a gate insulating layer 122*c*, and a passivation layer 122*d* to be described below. The inorganic layer 122 will be described in more detail below with reference to FIGS. 4 to 6C.

The planarization layer 123 and the bank 124 are disposed on the inorganic layer 122. Specifically, the planarization layer 123 may be disposed so as to enclose a top surface and a side surface of the inorganic layer 121 in the non-active area NA of the first substrate 121. The planarization layer 123 and the bank 124 will be described in more detail below with reference to FIGS. 4 to 6C.

The pixel unit PP is disposed on the inorganic layer 122. The pixel unit PP may be disposed so as to correspond to the display area AA. The pixel unit PP is a component which includes a plurality of sub pixels to display images. The plurality of sub pixels of the pixel unit PP are minimum units which configure the active area AA and a light emitting diode and a driving circuit may be disposed in each of the plurality of sub pixels. For example, the light emitting diode of each of the plurality of sub pixels may include an organic light emitting diode including an anode, an organic emission layer, and a cathode or an LED including an N-type and a P-type semiconductor layers and an emission layer, but is not limited thereto. The driving circuit for driving the plurality of sub pixels may include a driving element such as a thin film transistor or a storage capacitor, but is not limited thereto. Hereinafter, for the convenience of description, it is assumed that the light emitting diode of each of the plurality of sub pixels is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the first substrate 121 on which the light emitting diode is disposed. In the case of the top emission type, a reflective layer may be formed below the anode to allow the light emitted from the organic light emitting diode to travel to the upper portion of the first substrate 121, that is, toward the cathode.

According to the bottom emission type, light emitted from the light emitting diode is emitted to a lower portion of the first substrate 121 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the first substrate 121.

Hereinafter, for the convenience of description, the description will be made by assuming that the display device 100 according to an exemplary embodiment of the present disclosure is a bottom emission type display device, but it is not limited thereto.

The adhesive layer 125 is disposed so as to cover the pixel unit PP. Further, the adhesive layer 125 serves to bond the first substrate 121 and a second substrate 126 and encloses the pixel unit PP to protect the light emitting diode of the pixel unit PP from external moisture, oxygen, and impacts. The adhesive layer 125 may be configured by a face seal manner. For example, the adhesive layer 125 may be formed by forming ultraviolet or thermosetting sealant on the entire surface of the pixel unit PP. However, the structure of the adhesive layer 125 may be formed by various methods and materials, but is not limited thereto. As shown in FIG. 2, an end of the second substrate 126 is inset from an end of the first substrate 121 such that the end of the first substrate 121 extends past the end of the second substrate 126.

In the meantime, the second substrate 126 which has a high modulus and is formed of a metal material having a strong corrosion resistance is disposed on the adhesive layer 125. For example, the second substrate 126 may be formed of a material having a high modulus of approximately 200 to 900 Mpa. The second substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the second substrate 126 is formed of a metal material, the second substrate 126 may be implemented as an ultra-thin film and provide a strong resistance against external impacts and scratches.

A polarizer 180 is disposed below the first substrate 121. The polarizer 180 selectively transmits light to reduce the reflection of external light which is incident onto the first substrate 121. Specifically, in the display device 100, various metal materials which are applied to semiconductor devices, wiring lines, and light emitting diodes are formed on the first substrate 121. Therefore, the external light incident onto the first substrate 121 may be reflected from the metal material so that the visibility of the display device 100 may be reduced due to the reflection of the external light. At this time, the polarizer 180 which suppresses the reflection of external light is disposed below the first substrate 121 to increase outdoor visibility of the display device 100. However, the polarizer 180 may be omitted depending on an implementation example of the display device 100.

Even though not illustrated in the drawing, a barrier film may be disposed below the first substrate 121 together with the polarizer 180. The barrier film reduces the permeation of the moisture and oxygen outside the first substrate 121 into the first substrate 121 to protect the pixel unit PP including a light emitting diode. However, the barrier film may be omitted depending on an implementation example of the display device 100, but it is not limited thereto.

The adhesive layer 130 for bonding the back cover 110 to the second substrate 126 is disposed above the display panel 120 configured as described above. That is, the adhesive layer 130 is disposed between the second substrate 126 of the display panel 120 and the back cover 110. The adhesive layer 130 may be disposed on an entire surface of the active area AA and the end of the adhesive layer 130 disposed in the non-active area NA is disposed closer to the active area AA than end of the inorganic layer 122 in an area excluding an area to which the plurality of flexible films 140 is connected in the display panel 120. Therefore, bubbles generated in the adhesive layer 130 due to a step difference between the second substrate 126 and the seal member 160 are blocked to also block the crack caused by the bubbles. The step difference occurs due to a height of an uppermost surface of the seal member 160 being greater than a height of an uppermost surface of the second substrate 126. The adhesive layer 130 is formed of a material having an adhesiveness and for example, may be a double sided (DS) tape. The adhesive layer 130 will be described below in more detail with reference to FIGS. 6A to 6C.

The seal member 160 is disposed so as to enclose the side surface of the display panel 120. The seal member 160 is located on a top surface of the bank 124 and extends to an end of the non-active area NA such that the seal member 160 is on a part of an upper side surface of the second substrate 126 while enclosing the side surface of the pixel unit PP.

Therefore, the seal member 160 may reduce the moisture permeation through the side portion of the display panel 120 to the pixel unit PP.

The seal member 160 may be formed of a non-conducting material having an elasticity so as to seal the side surface of the display panel 120 and reinforce the lateral rigidity of the display panel 120. Further, the seal member 160 may be formed of a material having an adhesiveness. Further, the seal member 160 may further include an absorbent which absorbs moisture and oxygen from the outside to reduce the moisture permeation through the side portion of the display panel 120. For example, the seal member 160 may be formed of polyimide (PI), polyurethane, epoxy, or acryl based material, but is not limited thereto.

Hereinafter, the plurality of sub pixels of the pixel unit PP will be described in more detail with reference to FIGS. 3 to 6C.

Figure 3:
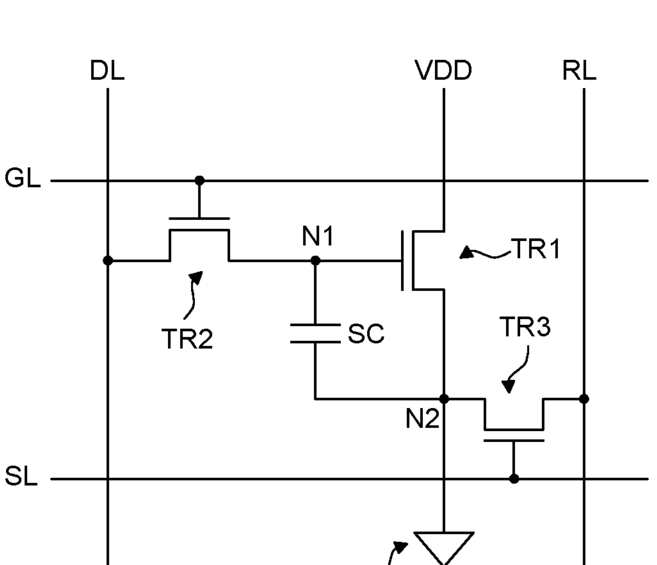
FIG. 3 is a circuit diagram of a sub pixel of a display device according to an exemplary embodiment of the present disclosure.

FIG. 3 is a circuit diagram of a sub pixel of a display device according to an exemplary embodiment of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the first substrate 121.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current may flow from the source electrode to the drain electrode. Since in the N-type thin film transistor, electrons flow from the source electrode to the drain electrode, the current may flow from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 may be turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of the plurality of capacitor electrodes is connected to the first node N1 and the other one may be connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary embodiment of the present disclosure has a 3T1C structure including three transistors and one storage capacitor SC. However, the number and a connection relationship of the transistors and the storage capacitor may vary in various ways depending on the design and are not limited thereto.

Figure 4:
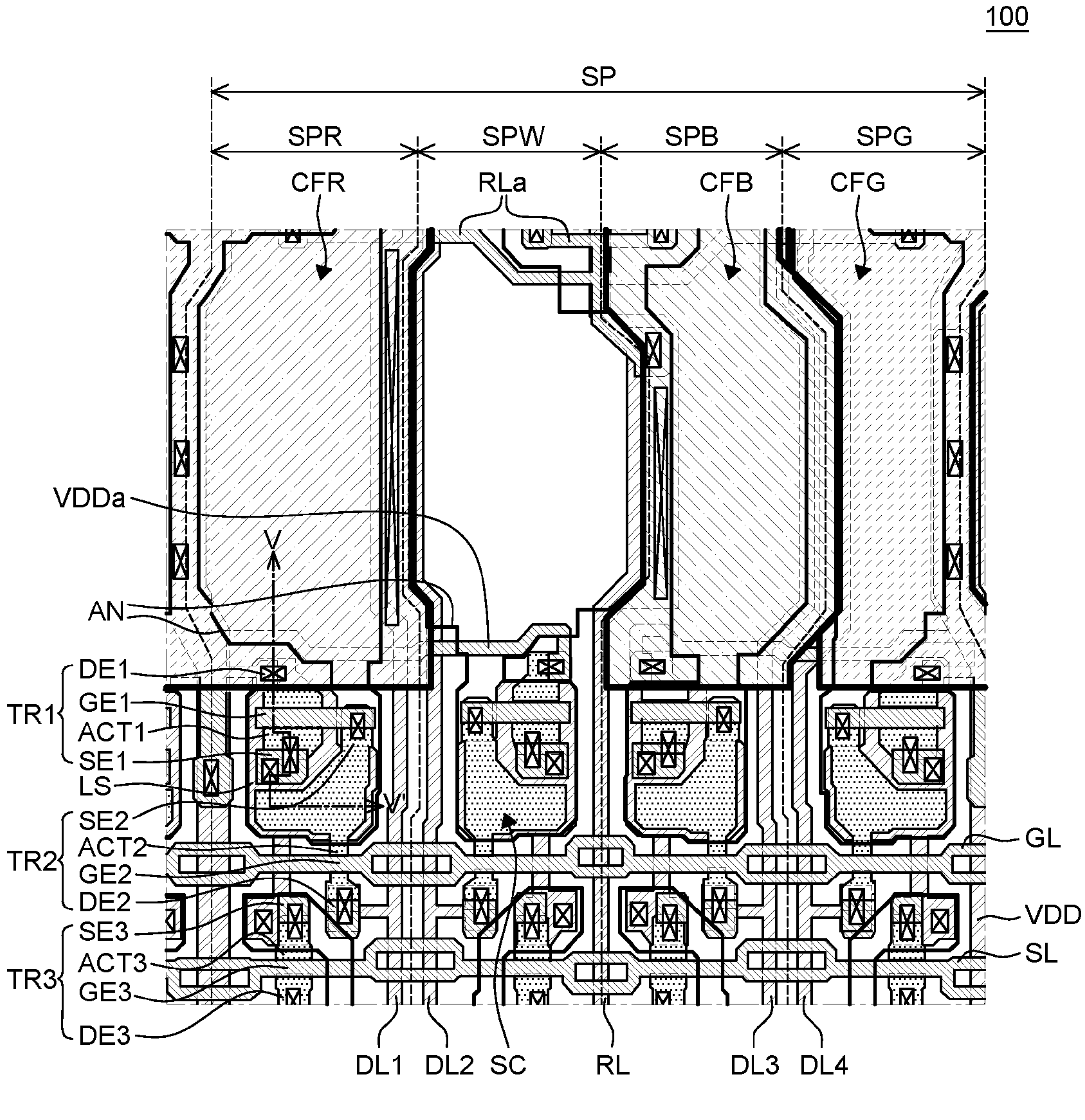
FIG. 4 is an enlarged plan view of one pixel of a display device according to an exemplary embodiment of the present disclosure.
Figure 5:
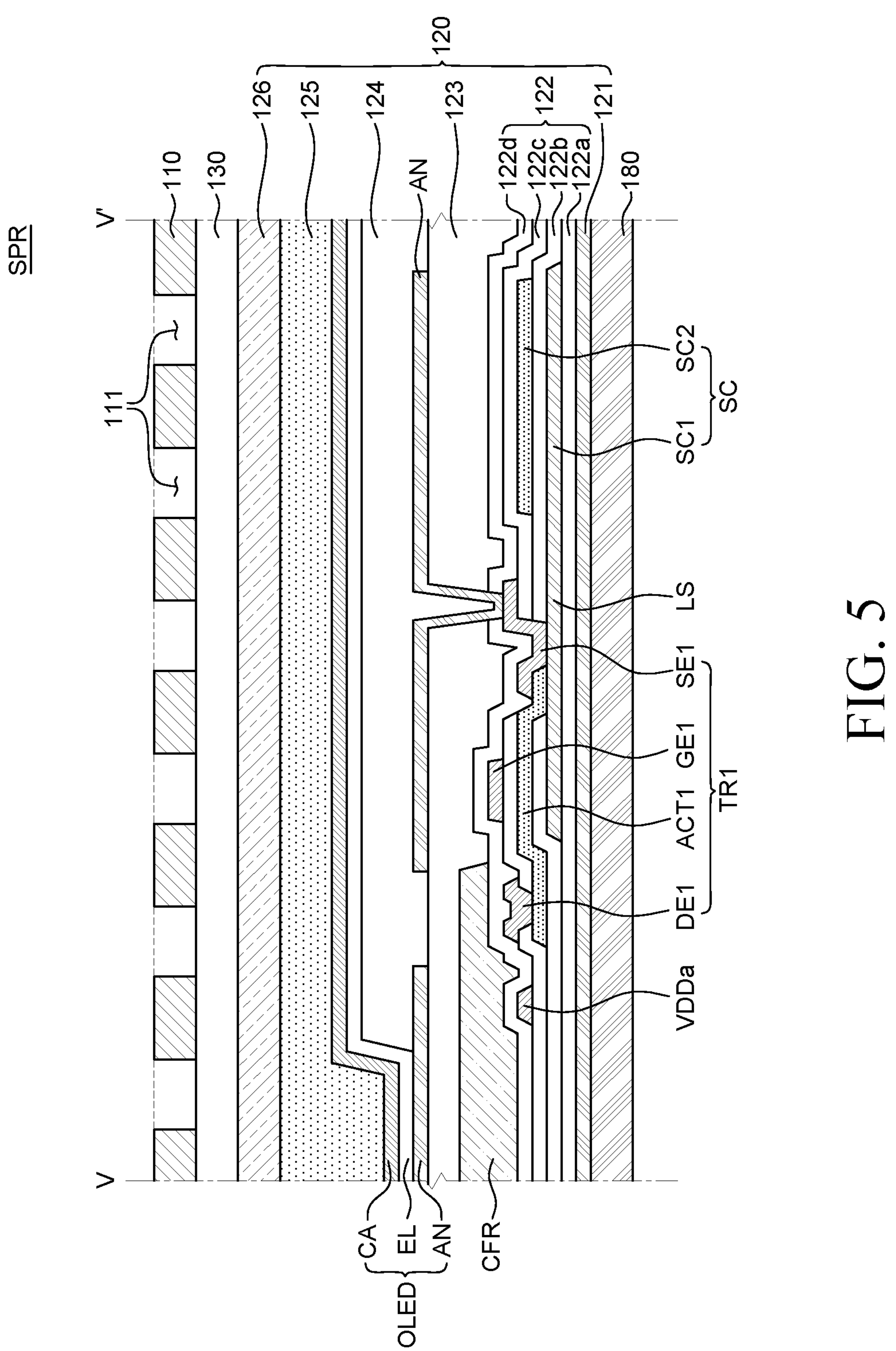
FIG. 5 is a cross-sectional view taken along a line V-V' of FIG. 4 according to an exemplary embodiment of the present disclosure.
Figure 6A:
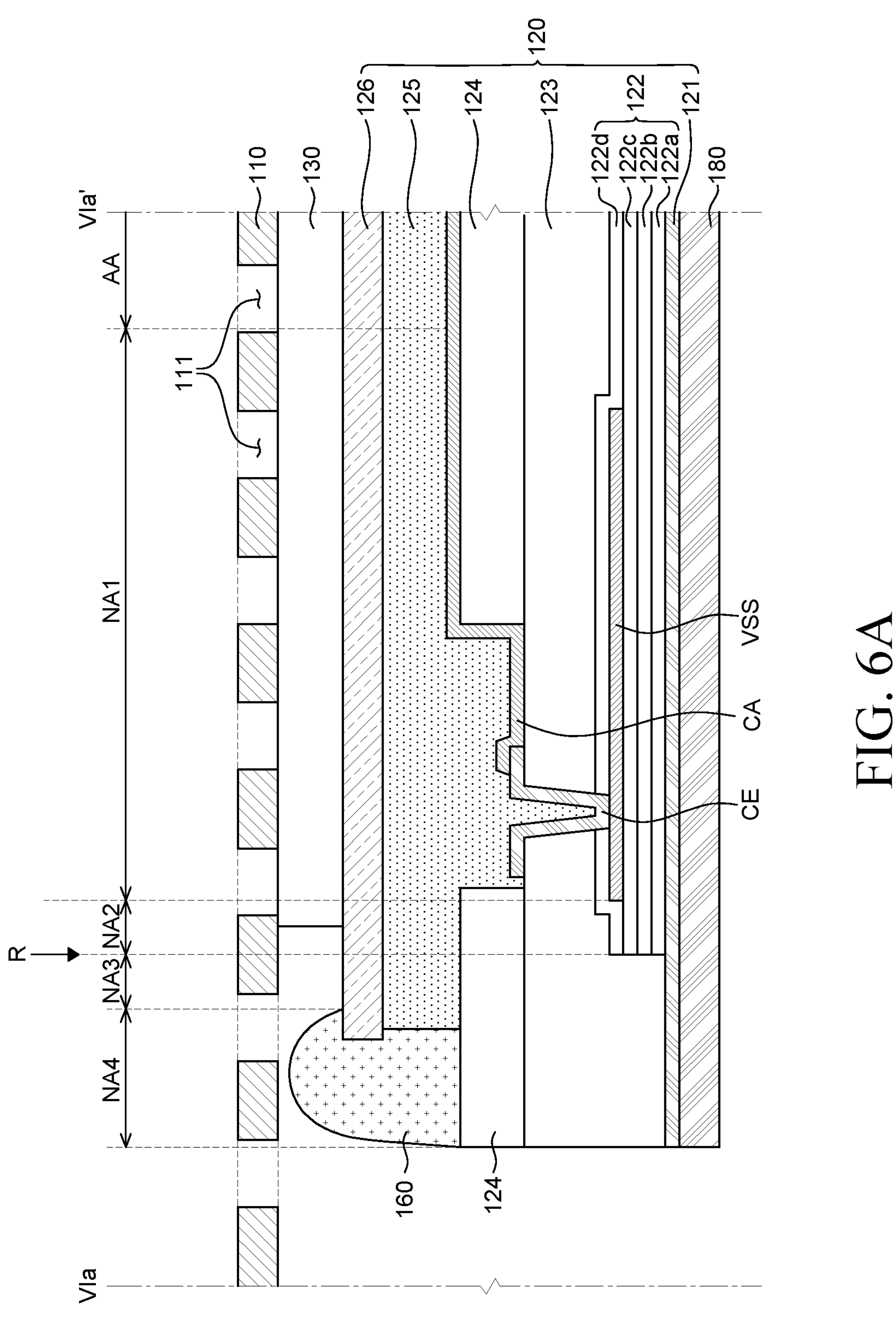
FIG. 6A is a cross-sectional view taken along a line Via-Via' of FIG. 1 according to an exemplary embodiment of the present disclosure.
Figure 6B:
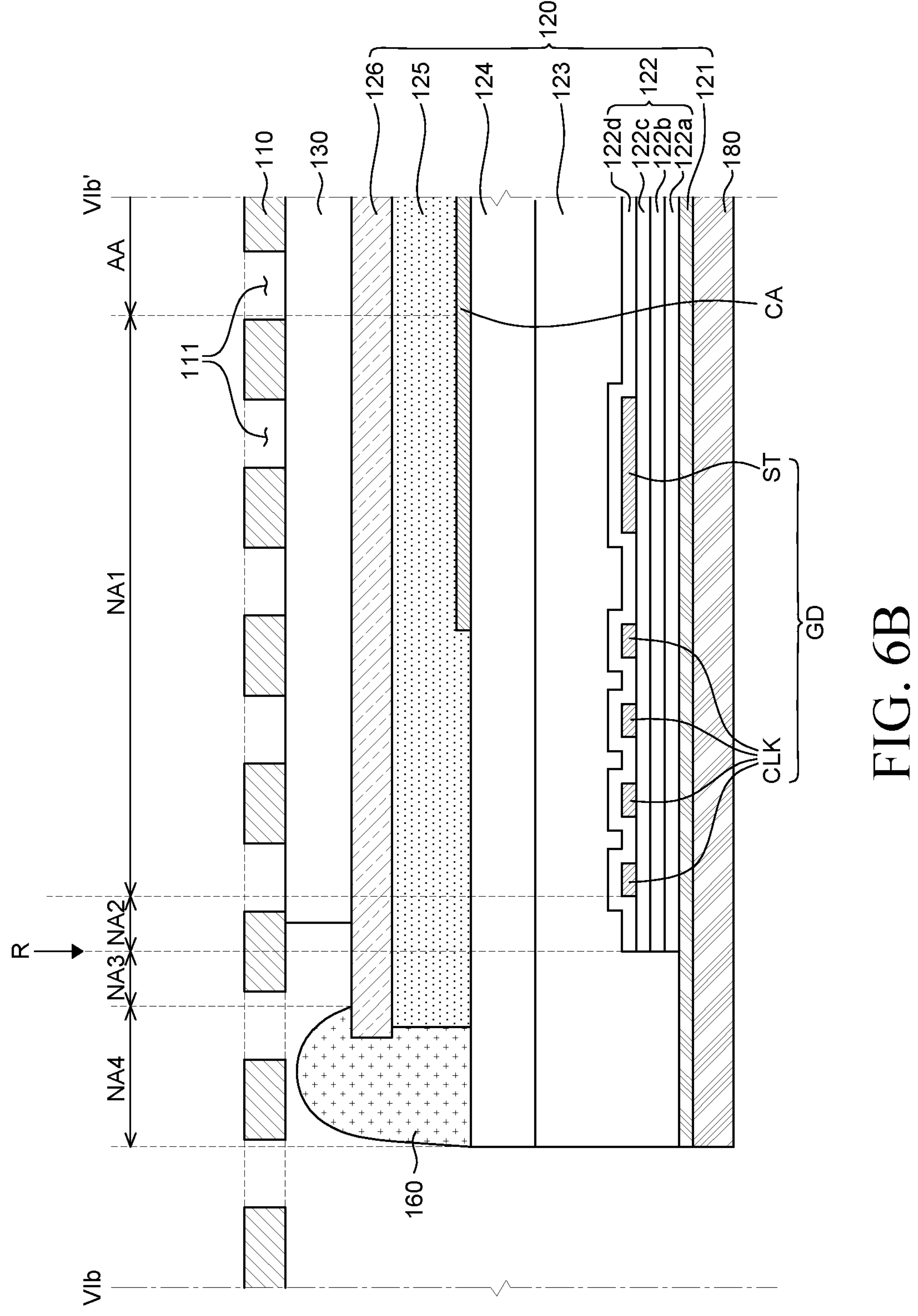
FIG. 6B is a cross-sectional view taken along a line Vib-Vib' of FIG. 1 according to an exemplary embodiment of the present disclosure.
Figure 6C:
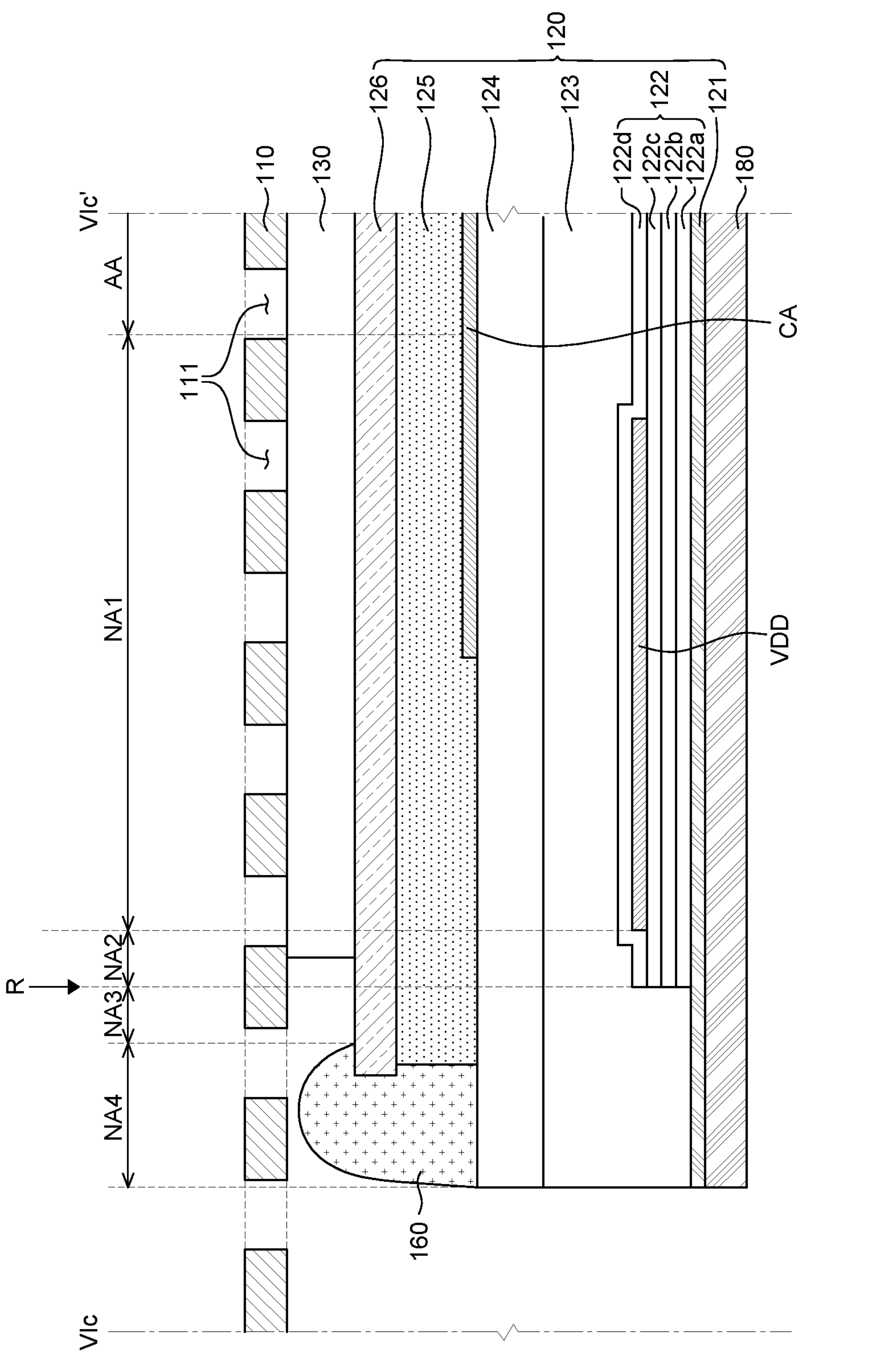
FIG. 6C is a cross-sectional view taken along a line Vic-Vic' of FIG. 1 according to an exemplary embodiment of the present disclosure.

FIG. 4 is an enlarged plan view of one pixel of a display device according to an exemplary embodiment of the present disclosure. FIG. 5 is a cross-sectional view taken along the line V-V' of FIG. 4 according to an exemplary embodiment of the present disclosure. FIG. 6A is a cross-sectional view taken along the line Via-Via' of FIG. 1 according to an exemplary embodiment of the present disclosure. FIG. 6B is a cross-sectional view taken along the line Vib-Vib' of FIG. 1 according to an exemplary embodiment of the present disclosure. FIG. 6C is a cross-sectional view taken along the line Vic-Vic' of FIG. 1 according to an exemplary embodiment of the present disclosure. FIG. 4 is an enlarged plan view of a red sub pixel SPR, a white sub pixel SPW, a blue sub pixel SPB, and a green sub pixel SPG which configure one pixel disposed in the active area AA of the display panel 120. In FIG. 4, only the display panel 120 is illustrated and for the convenience of description, the bank 124 is omitted and edges of the plurality of color filters CF are illustrated with a bold solid line. Referring to FIGS. 4 to 6C, the display device 100 according to the exemplary embodiment of the present disclosure includes the display panel 120, the back cover 110, the adhesive layer 130, the seal member 160, and the polarizer 180. The display panel 120 includes the first substrate 121, the inorganic layer 122, the planarization layer 123, the bank 124, a first transistor TR1, a second transistor TR2, a third transistor TR3, a storage capacitor SC, a light emitting diode OLED, a gate line GL, a sensing line SL, a data line DL, a reference line RL, a high potential power line VDD, a plurality of color filters CF, an adhesive layer 125, and a second substrate 126.

Referring to FIG. 4, the plurality of sub pixels SP includes a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a row direction. However, the placement order of the plurality of sub pixels SP is not limited thereto.

Each of the plurality of sub pixels SP includes an emission area and a circuit area. The emission area is an area where one color light may be independently emitted and the light emitting diode OLED may be disposed therein. Specifically, in an area where the plurality of color filters CF and the anode AN overlap, an area which is exposed from the bank 124 to allow light emitted from the light emitting diode OLED to travel to the outside may be defined as an emission area. For example, referring to FIGS. 4 and 5 together, an emission area of the red sub pixel SPR may be an area exposed from the bank 124 in an area in which the red color filter CFR and the anode AN overlap. An emission area of the green sub pixel SPG may be an area exposed from the bank 124 in an area in which the green color filter CFG and the anode AN overlap. An emission area of the blue sub pixel SPB may be an area exposed from the bank 124 in an area in which the blue color filter CFB and the anode AN overlap. At this time, in an emission area of the white sub pixel SPW in which a separate color filter CF is not disposed, an area overlapping a part of the anode AN exposed from the bank 124 may be a white emission area which emits white light.

The circuit area is an area excluding the emission area and a driving circuit DP for driving the plurality of light emitting diodes OLED and a plurality of wiring lines which transmits various signals to the driving circuit DP may be disposed. The circuit area in which the driving circuit DP, the plurality of wiring lines, and the bank 124 are disposed may be a non-emission area. For example, in the circuit area, the driving circuit DP including the first transistor TR1, the second transistor TR2, the third transistor TR3, and the storage capacitor SC, a plurality of high potential power lines VDD, a plurality of data lines DL, a plurality of reference lines RL, a plurality of gate lines GL, a sensing line SL, and the bank 124 may be disposed.

Referring to FIGS. 3 to 6C together, the inorganic layer 122 is disposed on the first substrate 121. The inorganic layer 122 may include a plurality of layers configured by an inorganic material disposed on the first substrate 121. For example, the inorganic layer 122 may include a lower buffer layer 122*a*, an upper buffer layer 122*b*, a gate insulating layer 122*c*, and a passivation layer 122*d*, but is not limited thereto.

The inorganic layer 122 may be disposed so as to expose an outermost area of the first substrate 121 in the non-active area NA. That is, an end of the inorganic layer 122 may be disposed at the inside of the end of the first substrate 121. In other words, the end of the inorganic layer 122 is inset from the end of the first substrate 121 such that the end of the first substrate 121 extends past the end of the inorganic layer 122.

In the meantime, when the first substrate 121 configured by one of the transparent conducting oxide layer or oxide semiconductor is used as described above, the first substrate 121 may be disposed in the entire area of the display device 100 for the LLO process. That is, the first substrate 121 may be disposed in the entire active area AA and non-active area NA of the display device 100.

Referring to FIGS. 6A to 6C, the inorganic layer 122 of the display device 100 according to the exemplary embodiment of the present disclosure may be disposed to a reference line R of the non-active area NA so as to expose an outermost area of the first substrate 100. Here, the reference line R defines an end point of the inorganic layer 122 and may be located between the second non-active area NA2 and the third non-active area NA3. Therefore, the inorganic layer 122 is cracked by being exposed to the outermost area or moisture permeation through the inorganic layer 122 may be reduced.

For reference, in the display device 100 according to the exemplary embodiment of the present disclosure, the non-active area NA may include a first non-active area NA1, a second non-active area NA2, a third non-active area NA3, and a fourth non-active area NA4. The first non-active area NA1 is an area that extends from an end of the active area AA to an end of a conductive material which forms a wiring line in the non-active area NA. The second non-active area NA2 is an area that extends from the end of the first non-active area NA1 to the reference line R. The third non-active area NA3 is an area that extends from the reference line R to an inner end of the seal member 160 disposed on an upper surface of the second substrate 126. The fourth non-active area NA4 is an area that extends from an end of the third non-active area NA3 to the end of the first substrate 121, that is, the fourth non-active area NA4 is an outermost area of the first substrate 121. The first non-active area NA1 may be surrounded (at least partially) by the second non-active area NA2 which may be surrounded (at least partially) by the third non-active area NA3. The fourth non-active area NA4 may surround (at least partially) the first non-active area NA1, the second non-active area NA2 and the third non-active area NA3.

The lower buffer layer 122*a* is disposed on the first substrate 121. The lower buffer layer 122*a* may suppress moisture and/or oxygen which penetrates from the outside of the first substrate 121 from being spread. The moisture permeation characteristic of the display device 120 may be controlled by controlling a thickness or a lamination structure of the lower buffer layer 122*a*. Further, the lower buffer layer 122*a* may suppress a short defect from being caused when the first substrate 121 formed of a transparent conducting oxide or an oxide semiconductor is in contact with the other configurations such as the pixel unit PP. The lower buffer layer 122*a* may be formed of an inorganic material, for example, may be configured by a single layer or a plurality of layers of silicon oxide (SiOx) and silicon nitride (SiNx), but is not limited thereto.

The plurality of high potential power lines VDD, the plurality of data lines DL, the plurality of reference lines RL, and the light shielding layer LS are disposed on the lower buffer layer 122*a*.

The plurality of high potential power lines VDD, the plurality of data lines DL, the plurality of reference lines RL, and the light shielding layer LS are disposed on the same layer on the first substrate 121 and may be formed of the same conductive material. For example, the plurality of high potential power lines VDD, the plurality of data lines DL, the plurality of reference lines RL, and the light shielding layer LS may be configured by a conductive material, such as copper (Cu), aluminum (Al), molybdenum (Mo), nickel (Ni), titanium (Ti), chrome (Cr), or an alloy thereof, but are not limited thereto.

The plurality of high potential power lines VDD is wiring lines which transmit the high potential power signal to each of the plurality of sub pixels SP. The plurality of high potential power lines VDD may extend between the plurality of sub pixels SP in a column direction and two sub pixels SP which are adjacent to each other in the row direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG. Referring to FIG. 6C, end of the plurality of high potential power lines VDD may be located at an end of the first non-active area NA1 and a starting point of the second non-active area NA2.

The plurality of data lines DL is lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG.

Referring to FIGS. 4 and 5 together, the light shielding layer LS is disposed on the lower buffer layer 122*a*. The light shielding layer LS is disposed so as to overlap the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material such as copper (Cu), aluminum (Al), molybdenum (Mo), nickel (Ni), titanium (Ti), chrome (Cr), or an alloy thereof is disposed so as to overlap the first active layer ACT1, light incident from the lower portion of the first substrate 121 onto the first active layer ACT may be blocked.

Accordingly, the reliability of the first transistor TR1 may be improved. However, it is not limited thereto and the light shielding layer LS may be disposed so as to overlap the second active layer ACT2 of the second transistor TR2 and the third active layer ACT3 of the third transistor TR3.

In the meantime, even though in the drawing, it is illustrated that the light single layer LS is a single layer, the light shielding layer LS may be formed as a plurality of layers. For example, the light shielding layer LS may be formed between the inorganic layers 122, that is, formed of a plurality of layers disposed so as to overlap each other, with at least one of the lower buffer layer 122*a*, the upper buffer layer 122*b*, the gate insulating layer 122*c*, and the passivation layer 122*d* therebetween.

The upper buffer layer 122*b* is disposed on the plurality of high potential power lines VDD, the plurality of data lines DL, the plurality of reference lines RL, and the light shielding layer LS. The upper buffer layer 122*b* may reduce permeation of moisture or impurities through the first substrate 121. For example, the upper buffer layer 122*b* may be configured by a single layer or a plurality of layers of silicon oxide (SiOx) or silicon nitride (SiNx), but is not limited thereto. Further, the upper buffer layer 122*b* may be omitted depending on a type of first substrate 121 or a type of transistor, but is not limited thereto.

In each of the plurality of sub pixels SP, the first transistor TR1, the second transistor TR2, the third transistor TR3, and the storage capacitor SC are disposed on the upper buffer layer 122*b*.

First, the first transistor TR1 includes a first active layer ACT1, a first gate electrode GE1, a first source electrode SE1, and a first drain electrode DE1.

The first active layer ACT1 is disposed on the upper buffer layer 122*b*. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 122*c* is disposed on the first active layer ACT1. The gate insulating layer 122*c* is a layer for electrically insulating the first gate electrode GE1 from the first active layer ACT1 and may be formed of an insulating material. For example, the gate insulating layer 122*c* may be configured by a single layer or a plurality of layers of silicon oxide (SiOx) or silicon nitride (SiNx), but is not limited thereto.

The first gate electrode GEL is disposed on the gate insulating layer 122*c* so as to overlap the first active layer ACT1. The first gate electrode GE1 may be configured by a conductive material such as copper (Cu), aluminum (Al), molybdenum (Mo), nickel (Ni), titanium (Ti), chrome (Cr), or an alloy thereof, but is not limited thereto.

A first source electrode SE1 and a first drain electrode DE1 which are spaced apart from each other are disposed on the gate insulating layer 122*c*. The first source electrode SE1 and the first drain electrode DE1 may be electrically connected to the first active layer ACT1 through a contact hole formed on the gate insulating layer 122*c*. The first source electrode SE1 and the first drain electrode DE1 may be disposed on the same layer as the first gate electrode GE1 to be formed of the same conductive material, but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPG.

At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end may be electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 122*c* and the upper buffer layer 122*b*. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto.

The first source electrode SE1 may be electrically connected to the light shielding layer LS through a contact hole formed on the gate insulating layer 122*c* and the upper buffer layer 122*b*. Further, a part of the first active layer ACT1 connected to the first source electrode SE1 may be electrically connected to the light shielding layer LS through a contact hole formed on and the upper buffer layer 122*b*. If the light shielding layer LS is floated, a threshold voltage of the first transistor TR1 fluctuates to affect the driving of the display panel 120. Accordingly, the light shielding layer LS is electrically connected to the first source electrode SE1 to apply a voltage to the light shielding layer LS and the driving of the first transistor TR1 may not be affected. However, in the present specification, even though it has been described that both the first active layer ACT1 and the first source electrode SE1 are in contact with the light shielding layer LS, only any one of the first source electrode SE1 and the first active layer ACT1 is in direct contact with the light shielding layer. It is not limited thereto.

In the meantime, even though in FIG. 5, it is illustrated that the gate insulating layer 122*c* is formed on the entire surface of the first substrate 121, the gate insulating layer 122*c* may be patterned so as to overlap only the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the upper buffer layer 122*b*. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the upper buffer layer 122*b*. The second source electrode SE2 may be integrally formed with the second active layer ACT2 to be electrically connected to each other. For example, the semiconductor material is formed on the upper buffer layer 122*b* and a part of the semiconductor material is conducted to form the second source electrode SE2. Therefore, a part of the semiconductor material which is not conducted may become a second active layer ACT2 and a conducted part may serve as a second source electrode SE2. However, the second active layer ACT2 and the second source electrode SE2 may be separately formed, but are not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 122*c*. Accordingly, the first transistor TR1 may be turned on or turned off by a signal from the second transistor TR2.

The gate insulating layer 122*c* is disposed on the second active layer ACT2 and the second source electrode SE2 and the second drain electrode DE2 and the second gate electrode GE2 are disposed on the gate insulating layer 122*c*.

The second gate electrode GE2 is disposed on the gate insulating layer 122*c* so as to overlap the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material such as copper (Cu), aluminum (Al), molybdenum (Mo), nickel (Ni), titanium (Ti), chrome (Cr), or an alloy thereof, but is not limited thereto.

In the meantime, the second gate electrode GE2 may extend from the gate line GL. That is, the second gate electrode GE2 may be integrally formed with the gate line GL and the second gate electrode GE2 and the gate line GL may be formed of the same conductive material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 122*c*. The second drain electrode DE2 is electrically connected to the second active layer ACT2 through a contact hole formed in the gate insulating layer 122*c* and may be electrically connected to one of the plurality of data lines DL through a contact hole formed in the gate insulating layer 122*c* and the upper buffer layer 122*b*, simultaneously. For example, the second drain electrode DE2 of the red sub pixel SPR is electrically connected to the first data line DL1 and the second drain electrode DE2 of the white sub pixel SPW may be electrically connected to the second data line DL2. For example, the second drain electrode DE2 of the blue sub pixel SPB is electrically connected to the third data line DL3 and the second drain electrode DE2 of the green sub pixel SPG may be electrically connected to the fourth data line DL4. The second drain electrode DE2 may be configured by a conductive material, such as copper (Cu), aluminum (Al), molybdenum (Mo), nickel (Ni), titanium (Ti), chrome (Cr), or an alloy thereof, but is not limited thereto. The third transistor TR3 includes a third active layer ACT3, a third gate electrode GE3, a third source electrode SE3, and a third drain electrode DE3.

The third active layer ACT3 is disposed on the upper buffer layer 122*b*. The third active layer ACT3 may be formed of a semiconductor material, such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region and the source region and the drain region may be conductive regions, but are not limited thereto.

The gate insulating layer 122*c* is disposed on the third active layer ACT3 and the third gate electrode GE3, the third source electrode SE3, and the third drain electrode DE3 are disposed on the gate insulating layer 122*c*.

The third gate electrode GE3 is disposed on the gate insulating layer 122*c* so as to overlap the third active layer ACT3. The third gate electrode GE3 may be electrically connected to the sensing line SL and the third transistor TR3 may be turned on or turned off based on the sensing voltage transmitted to the third transistor TR3. The third gate electrode GE3 may be configured by a conductive material such as copper (Cu), aluminum (Al), molybdenum (Mo), nickel (Ni), titanium (Ti), chrome (Cr), or an alloy thereof, but is not limited thereto.

In the meantime, the third gate electrode GE3 may extend from the sensing line SL. That is, the third gate electrode GE3 may be integrally formed with the sensing line SL and the third gate electrode GE3 and the sensing line SL may be formed of the same conductive material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACT3 through a contact hole formed on the gate insulating layer 122*c*. The third source electrode SE3 may be configured by a conductive material, such as copper (Cu), aluminum (Al), molybdenum (Mo), nickel (Ni), titanium (Ti), chrome (Cr), or an alloy thereof, but is not limited thereto.

Further, a part of the third active layer ACT3 which is in contact with the third source electrode SE3 may be electrically connected to the light shielding layer LS through a contact hole formed in the upper buffer layer 122*b*. That is, the third source electrode SE3 may be electrically connected to the light shielding layer LS with the third active layer ACT3 therebetween. Therefore, the third source electrode SE3 and the first source electrode SE1 may be electrically connected to each other by means of the light shielding layer LS.

The third drain electrode DE3 may be electrically connected to the third active layer ACT3 through a contact hole formed on the gate insulating layer 122*c*. The third drain electrode DE3 may be configured by a conductive material such as copper (Cu), aluminum (Al), molybdenum (Mo), nickel (Ni), titanium (Ti), chrome (Cr), or an alloy thereof, but is not limited thereto.

The third drain electrode DE3 may be electrically connected to the reference line RL. For example, the third drain electrodes DE3 of the red sub pixel SPR, the white sub pixel SPW, the blue sub pixel SPB, and the green sub pixel SPG may be electrically connected to the same reference line RL. That is, the plurality of sub pixels SP which forms one pixel may share one reference line RL.

At this time, an auxiliary reference line RLa may be disposed to transmit the reference line RL extending in the column direction to the plurality of sub pixels SP which is disposed in parallel along the row direction. The auxiliary reference line R1*a* extends in the row direction to electrically connect the reference line RL and the third drain electrode DE3 of each of the plurality of sub pixels SP. One end of the auxiliary reference line R1*a* may be electrically connected to the reference line RL through a contact hole formed in the upper buffer layer 122*b* and the gate insulating layer 122*c*. The other end of the auxiliary reference line R1*a* may be electrically connected to the third drain electrode DE3 of each of the plurality of sub pixels SP. In this case, the auxiliary reference line R1*a* may be integrally formed with the third drain electrode DE3 of each of the plurality of sub pixels SP and a reference voltage from the reference line RL may be transmitted to the third drain electrode DE3 by means of the auxiliary reference line R1*a*. However, the auxiliary reference line R1*a* may be separately formed from the third drain electrode DE3, but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first capacitor electrode SC1 and a second capacitor electrode SC2.

In each of the plurality of sub pixels SP, the first capacitor electrode SC1 is disposed between the lower buffer layer 122*a* and the upper buffer layer 122*b*. The first capacitor electrode SC1 may be disposed to be the closest to the first substrate 121 among the conductive components disposed on the first substrate 121. The first capacitor electrode SC1 may be integrally formed with the light shielding layer LS and may be electrically connected to the first source electrode SE1 by means of the light shielding layer LS.

The upper buffer layer 122*b* is disposed on the first capacitor electrode SC1 and the second capacitor electrode SC2 is disposed on the upper buffer layer 122*b*. The second capacitor electrode SC2 may be disposed so as to overlap the first capacitor electrode SC1. The second capacitor electrode SC2 is integrally formed with the second source electrode SE2 to be electrically connected to the second source electrode SE2 and the first gate electrode GE1. For example, the semiconductor material is formed on the upper buffer layer 122*b* and a part of the semiconductor material is conductorized to form the second source electrode SE2 and the second capacitor electrode SC2. Accordingly, a part of the semiconductor material which is not conductorized functions as a second active layer ACT2 and the conductorized part may function as a second source electrode SE2 and the second capacitor electrode SC2. As described above, the first gate electrode GE1 is electrically connected to the second source electrode SE2 through the contact hole formed in the gate insulating layer 122*c*. Accordingly, the second capacitor electrode SC2 is integrally formed with the second source electrode SE2 to be electrically connected to the second source electrode SE2 and the first gate electrode GE1.

In summary, the first capacitor electrode SC1 of the storage capacitor SC is integrally formed with the light shielding layer LS to be electrically connected to the light shielding layer LS, the first source electrode SE1, and the third source electrode SE3. Accordingly, the second capacitor electrode SC2 is integrally formed with the second source electrode SE2 and the active layer ACT2 to be electrically connected to the second source electrode SE2 and the first gate electrode GE1. Accordingly, the first capacitor electrode SC1 and the second capacitor electrode SC2 which overlap with the upper buffer layer 122*b* therebetween constantly maintain the voltage of the first gate electrode GE1 and the first source electrode SE1 of the first transistor TR1 to maintain the constant state of the light emitting diode OLED.

Referring to FIGS. 6A and 6B, in the non-active area NA, the low potential power line VSS and the gate driver GD (e.g., a conductive element) may be disposed on the gate insulating layer 122*c*.

Referring to FIG. 6A, the low potential power line VSS is electrically connected to the cathode CA to supply a low potential voltage to the cathode CA. That is, the low potential power line VSS is electrically connected to the cathode CA through the connection electrode CE which is formed together while forming the anode AN. An end of the low potential power line VSS may be a boundary between the first non-active area NA1 and the second non-active area NA2.

Referring to FIG. 6B, the gate driver GD is disposed in the non-active area NA and the gate driver GD includes a clock line CLK and a stage ST.

The clock line CLK may transmit a clock signal to the stage ST. Four clock lines CLK, as illustrated in FIG. 6B, may transit at least one clock signal having different phases to the stage ST. At this time, a clock line which is disposed to be the most adjacent to the end of the first substrate 121, among four clock lines CLK may be a boundary between the first non-active area NA1 and the second non-active area NA2. Even though in FIG. 6B, it is illustrated that four clock lines CLK are used, the number of clock lines CLK is not limited thereto.

The stage ST is disposed between the active area AA and the clock line CLK to output a scan signal corresponding to the driving signal. Even though in FIG. 6B, it is illustrated that the stage ST is a single layer, this is for the convenience of description so that the stage ST may be configured by various transistors and/or capacitors.

Referring to FIG. 6C, the high potential power line VDD is disposed in the non-active area NA. Ends of the plurality of high potential power lines VDD may be a boundary between the first non-active area NA1 and the second non-active area NA2.

The passivation layer 122*d* is disposed on the first transistor TR1, the second transistor TR2, the third transistor TR3, and the storage capacitor SC in the active area AA and the low potential power line VSS, the high potential power line VDD, and the gate driver GD in the non-active area NA. The passivation layer 122*d* is an insulating layer for protecting components below the passivation layer 122*d*. For example, the passivation layer 122*d* may be configured by a single layer or a plurality of layers of silicon oxide (SiOx) or silicon nitride (SiNx), but is not limited thereto. Further, the passivation layer 122*d* may be omitted depending on the exemplary embodiment.

A plurality of color filters CF are disposed in the emission area of each of the plurality of sub pixels SP on the passivation layer 122*d*. As described above, the display device 100 according to the exemplary embodiment of the present disclosure is a bottom emission type in which light emitted from the light emitting diode OLED is directed to the lower portion of the light emitting diode OLED and the first substrate 110. Therefore, the plurality of color filters CF may be disposed below the light emitting diode OLED. Light emitted from the light emitting diode OLED passes through the plurality of color filters CF and is implemented as various colors of light.

The plurality of color filters CF includes a red color filter CFR, a blue color filter CFB, and a green color filter CFG. The red color filter CFR may be disposed in an emission area of a red sub pixel SPR of the plurality of sub pixels SP, the blue color filter CFB may be disposed in an emission area of the blue sub pixel SPB, and the green color filter CFG may be disposed in an emission area of the green sub pixel SPG.

The planarization layer 123 is disposed on the passivation layer 122*d* and the plurality of color filters CF.

The planarization layer 123 is an insulating layer which planarizes an upper portion of the first substrate 121 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 123 may be disposed on the entire surface of the first substrate 121. That is, the planarization layer 123 may be not only disposed in the active area AA, but also disposed to the end of the first substrate 121 while enclosing the end of the inorganic layer 122 located in the non-active area NA. Therefore, in the display device 100 according to one exemplary embodiment of the present disclosure, the planarization layer 123 is disposed so as to cover an end of the inorganic layer 122 to reduce the damage of the inorganic layer 123.

The light emitting diode OLED is disposed in an emission area of each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 123 in the emission area. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the meantime, the anode AN may extend toward the circuit area. A part of the anode AN may extend toward the first source electrode SE1 of the circuit area from the emission area and may be electrically connected to the first source electrode SE1 through a contact hole formed in the planarization layer 123 and the passivation layer 122*d*. Accordingly, the anode AN of the light emitting diode OLED extends to the circuit area to be electrically connected to the first source electrode SE1 of the first transistor TR1 and the second capacitor electrode SC2 of the storage capacitor SC.

In the emission area and the circuit area, the emission layer EL is disposed on the anode AN. The emission layer EL may be formed as one layer over the plurality of sub pixels SP. That is, the emission layers EL of the plurality of sub pixels SP are connected to each other to be integrally formed. The emission layer EL may be configured by one emission layer or may have a structure in which a plurality of emission layers which emits different color light is laminated. The emission layer EL may further include an organic layer, such as a hole injection layer, a hole transport layer, an electron transport layer, and an electron injection layer.

The cathode CA is disposed on the emission layer EL in the emission area and the circuit area. The cathode CA supplies electrons to the emission layer EL so that the cathode may be formed of a conductive material having a low work function. The cathode CA may be formed as one layer over the plurality of sub pixels SP. That is, each of the cathodes CA of the plurality of sub pixels SP are connected to be integrally formed. For example, the cathode CA may be formed of a transparent conductive material such as indium tin oxide (ITO) and indium zinc oxide (IZO) or ytterbium (Yb) alloy and may further include a metal doping layer, but is not limited thereto.

A bank 124 is disposed on the planarization layer 123 and the anode AN. That is, the bank 124 is disposed on the entire surface of the first substrate 121 in the active area AA and the non-active area NA. In the active area AA, the bank 124 is disposed between the anode AN and the emission layer EL to cover the edge of the anode AN. The bank 124 is disposed at the boundary between the sub pixels SP which are adjacent to each other to reduce the mixture of light emitted from the light emitting diode OLED of each of the plurality of sub pixels SP. In the non-active area NA, the bank 124 extends from the active area AA to be disposed on the planarization layer 123. The bank 124 may be formed of an insulating material, and for example, formed of polyimide, but is not limited thereto.

The cathode CA is disposed on the bank 124 and the adhesive layer 125 may be disposed on the cathode CA.

The second substrate 126 is disposed on the adhesive layer 125. The second substrate 126 may serve to protect the light emitting diode OLED from external moisture, oxygen, or impact together with the adhesive layer 125. For example, the second substrate 126 may be formed of a material having a high modulus of approximately 200 to 900 MPa. The second substrate 126 may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the second substrate 126 is formed of a metal material, the second substrate 126 may be implemented as an ultra-thin film and provide a strong resistance against external impacts and scratches.

The second substrate 126 is not disposed so as to overlap the entire surface of the first substrate 121, but is disposed to the partial area of the non-active area NA. At this time, the second substrate 126 may be disposed to outwardly protrude from the adhesive layer 125.

An adhesive layer 130 for bonding with the back cover 110 is disposed on the second substrate 126.

Generally, the adhesive layer 130 for bonding the display panel and the back cover is disposed on the entire surface of the display device. That is, the adhesive layer 130 is disposed not only on the entire surface of the second substrate 126, but also on the entire surface of the upper surface of the seal member 160. The back cover 110 is disposed on the adhesive layer disposed as described above to bond the display panel 120 and the back cover 110 and then the polarizer 180 is disposed below the display panel 120 to manufacture the display device. Here, as described above, the seal member is disposed so as to cover a part of the upper surface of the second substrate, so that a step difference is caused between the seal member and the second substrate.

As described above, when the adhesive layer 130 is formed on the entire upper surface of the seal member 160 and the entire surface of the second substrate 126, bubbles are generated due to the step difference between the seal member 160 and the second substrate 126 and the generated bubbles cause the crack. To be more specific, after bonding the upper surface of the display panel 120 and the back cover 110 by the adhesive layer 130, the polarizer 180 is bonded onto the lower surface of the display panel 120 using a roller by a lamination method. The bubbles generated due to the step difference between the seal member 160 and the second substrate 126 affect the inorganic layers of the display panel 120, that is, the lower buffer layer, the upper buffer layer, the gate insulating layer, and the passivation layer so that a crack is generated in the inorganic layers. However, in an area where the display panel and the plurality of flexible films are connected, the conductive adhesive layer ACF for electrical connection with the plurality of flexible films is disposed to fix the inorganic layers of the conductive adhesive layer. Accordingly, in an area where the display panel and the plurality of flexible films are connected, even though the adhesive layer is disposed on the entire surface, the crack is not generated.

Accordingly, in the display device 100 according to the exemplary embodiment of the present disclosure, as illustrated in FIGS. 6A to 6C, the adhesive layer 130 which bonds the display panel 120 and the back cover 110 is disposed to be spaced apart from the seal member 160, except for an area in which the plurality of flexible films 140 is connected to the display panel 120. That is, the adhesive layer 130 is non-overlapping with the seal member 160. The end of the adhesive layer 130 may be disposed between the second non-active area NA2 and the reference line R in the non-active area NA. To be more specific, an end of the adhesive layer 130 may be disposed between ends of the low potential voltage line VSS, the gate driver GD, and the high potential voltage line VDD and an end of the inorganic layer 122 in the non-active area NA. That is, the adhesive layer 130 may be disposed so as to cover the conductive material disposed in the inorganic layer 122. In other words, an end of the adhesive layer 130 extends past an end of any one of the high potential power line, the low potential power line, and the gate driver and is inset from the end of the inorganic layer 122.

As described above, in the display device 100 according to the exemplary embodiment of the present disclosure, the adhesive layer 130 which bonds the display panel 120 and the back cover 110 is disposed to be spaced apart from the seal member 160 with a predetermined distance. Therefore, the bubbles generated due to the step difference between the seal member 160 and the second substrate 126 are blocked to reduce the crack generated due to the bubbles.

Further, in the display device 100 according to the exemplary embodiment of the present disclosure, the adhesive layer 130 is disposed to be spaced apart from the seal member 160. In this case, the adhesive layer 130 covers (e.g., overlaps) the conductive material disposed in the inorganic layer 122, that is, ends of the low potential power line VSS, the gate driver GD, and the high potential power line VDD so that the end of the adhesive layer 130 is located over the end of the conductive material. Therefore, the crack generated in the wiring line formed by the conductive material is reduced.

Further, in the display device 100 according to the exemplary embodiment of the present disclosure, the first substrate 121 is formed of any one of a transparent conducting oxide and an oxide semiconductor to reduce a thickness of the display device 100. In the related art, the plastic substrate has been mainly used as the substrate of the display device. However, the plastic substrate is formed by coating and curing a substrate material at a high temperature so that there are problems in that it takes a long time and it is difficult to form the thickness to be lower than a predetermined level. In contrast, the transparent conducting oxide and the oxide semiconductor may be formed to have a very thin thickness by the deposition process such as sputtering. Therefore, in the display device 100 according to the exemplary embodiment of the present disclosure, the first substrate 121 which supports various components of the display panel 120 is configured by a transparent conducting oxide layer or the oxide semiconductor layer to reduce a thickness of the display device 100 and implement a slim design.

Further, in the display device 100 according to the exemplary embodiment of the present disclosure, the first substrate 121 is formed of a transparent conducting oxide or an oxide semiconductor to improve the flexibility of the display device 100 and reduce the stress generated when the display device 100 is deformed. Specifically, when the first substrate 121 is configured by the transparent conducting oxide layer or the oxide semiconductor, the first substrate 121 may be formed as a very thin film. In this case, the first substrate 121 may be also referred to as a first transparent thin film layer. Accordingly, the display device 100 including the first substrate 121 may have a high flexibility and the display device 100 may be easily bent or rolled. Therefore, in the display device 100 according to the exemplary embodiment of the present disclosure, the first substrate 121 is formed by any one of the transparent conducting oxide layer and the oxide semiconductor to improve the flexibility of the display device 100. Accordingly, the stress generated when the display device 100 is deformed may be also relieved so that the crack caused in the display device 100 may be reduced.

Further, in the display device 100 according to the exemplary embodiment of the present disclosure, the first substrate 121 is formed of any one of a transparent conducting oxide layer and an oxide semiconductor layer to reduce the possibility of generating the static electricity in the first substrate 121. If the first substrate 121 is formed of plastic so that the static electricity is generated, various wiring lines and driving elements on the first substrate 121 are damaged or the driving is affected due to the static electricity so that the display quality may be degraded. Instead, when the first substrate 121 is formed of the transparent conducting oxide layer or the oxide semiconductor layer, the static electricity generated in the first substrate 121 may be reduced and a configuration for blocking and discharging the static electricity may be simplified. Accordingly, in the display device 100 according to the exemplary embodiment of the present disclosure, the first substrate 121 is formed of any one of the transparent conducting oxide layer or the oxide semiconductor having a low possibility of generating the static electricity. By doing this, the damage or the display quality degradation due to the static electricity may be reduced.

Further, in the display device 100 according to the exemplary embodiment of the present disclosure, the first substrate 121 is formed of one of the transparent conducting oxide and the oxide semiconductor to reduce the permeation of the moisture or oxygen of the outside into the display device 100 by means of the first substrate 121. When the first substrate 121 is formed of the transparent conducting oxide layer or the oxide semiconductor, the first substrate 121 is formed in a vacuum environment so that the foreign material generation possibility is significantly low. Further, even though the foreign material is generated, the size of the foreign material is very small so that the permeation of the moisture and oxygen into the display device 100 may be reduced. Accordingly, in the display device 100 according to the exemplary embodiment of the present disclosure, the first substrate 121 is formed of a transparent conducting oxide or the oxide semiconductor having a low possibility of generating the foreign materials and an excellent moisture permeation performance. By doing this, the reliability of the light emitting diode OLED including an organic layer and the display device 100 may be improved.

In the display device 100 according to the exemplary embodiment of the present disclosure, the first substrate 121 is formed of any one of a transparent conducting oxide and an oxide semiconductor, and may be used after attaching a barrier film which is thin and cheap below the first substrate 121. When the first substrate 121 is formed of a material having a low moisture permeation performance, for example, plastic, the moisture permeation performance may be supplemented by attaching a high performance barrier film. However, in the display device 100 according to the exemplary embodiment of the present disclosure, the first substrate 121 is formed of a transparent conducting oxide or an oxide semiconductor having an excellent moisture permeation performance so that a thin and cheap barrier film may be attached below the first substrate 121. Accordingly, in the display device 100 according to the exemplary embodiment of the present disclosure, the first substrate 121 is configured by any one of the transparent conducting oxide or the oxide semiconductor having an excellent moisture permeation performance to reduce the manufacturing cost of the display device.

Further, in the display device 100 according to the exemplary embodiment of the present disclosure, the first substrate 121 is formed of any one of a transparent conducting oxide and an oxide semiconductor to perform a laser lift off (LLO) process. When the display device 100 is manufactured, a temporary substrate in which a sacrificial layer is formed is attached below the first substrate 121 and then a pixel unit PP may be formed on the first substrate 121. The sacrificial layer may use a hydrogenated amorphous silicon or an amorphous silicon which is hydrogenated and doped with impurities. After completing the manufacturing of the display device 100, when a laser is irradiated from the lower portion of the temporary substrate, the hydrogen of the sacrificial layer is dehydrogenated and the sacrificial layer and the temporary substrate may be separated from the first substrate 121. At this time, the transparent conducting oxide and the oxide semiconductor are materials which may perform the LLO process with the sacrificial layer and the temporary substrate. Therefore, even though the first substrate 121 is formed of any one of the transparent conducting oxide or the oxide semiconductor, the first substrate 121 may be easily separated from the temporary substrate. Accordingly, in the display device 100 according to the exemplary embodiment of the present disclosure, the first substrate 121 is configured by any one of the transparent conducting oxide layer or the oxide semiconductor which may perform the LLO process. Therefore, the display device 100 may be easily manufactured with the existing process and equipment.

Figure 7:
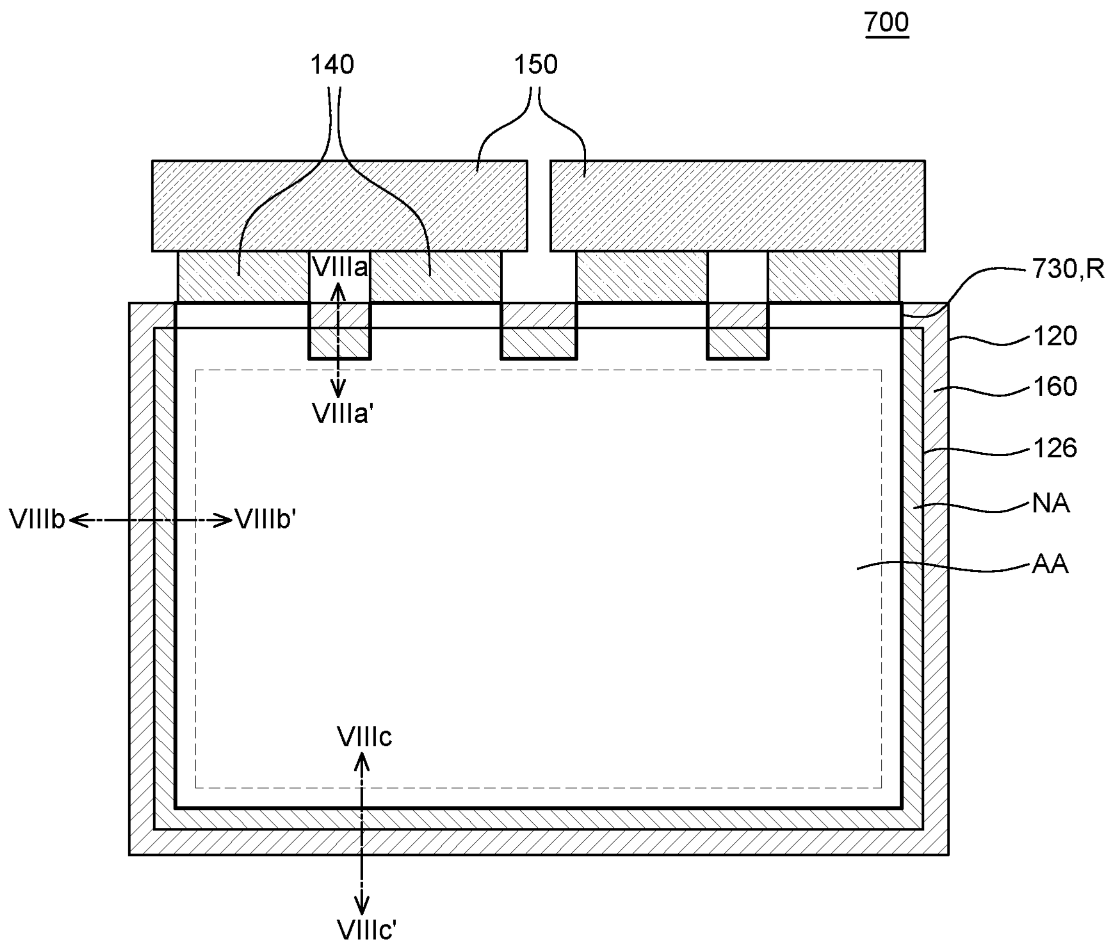
FIG. 7 is a plan view of a display device according to another exemplary embodiment of the present disclosure.
Figure 8A:
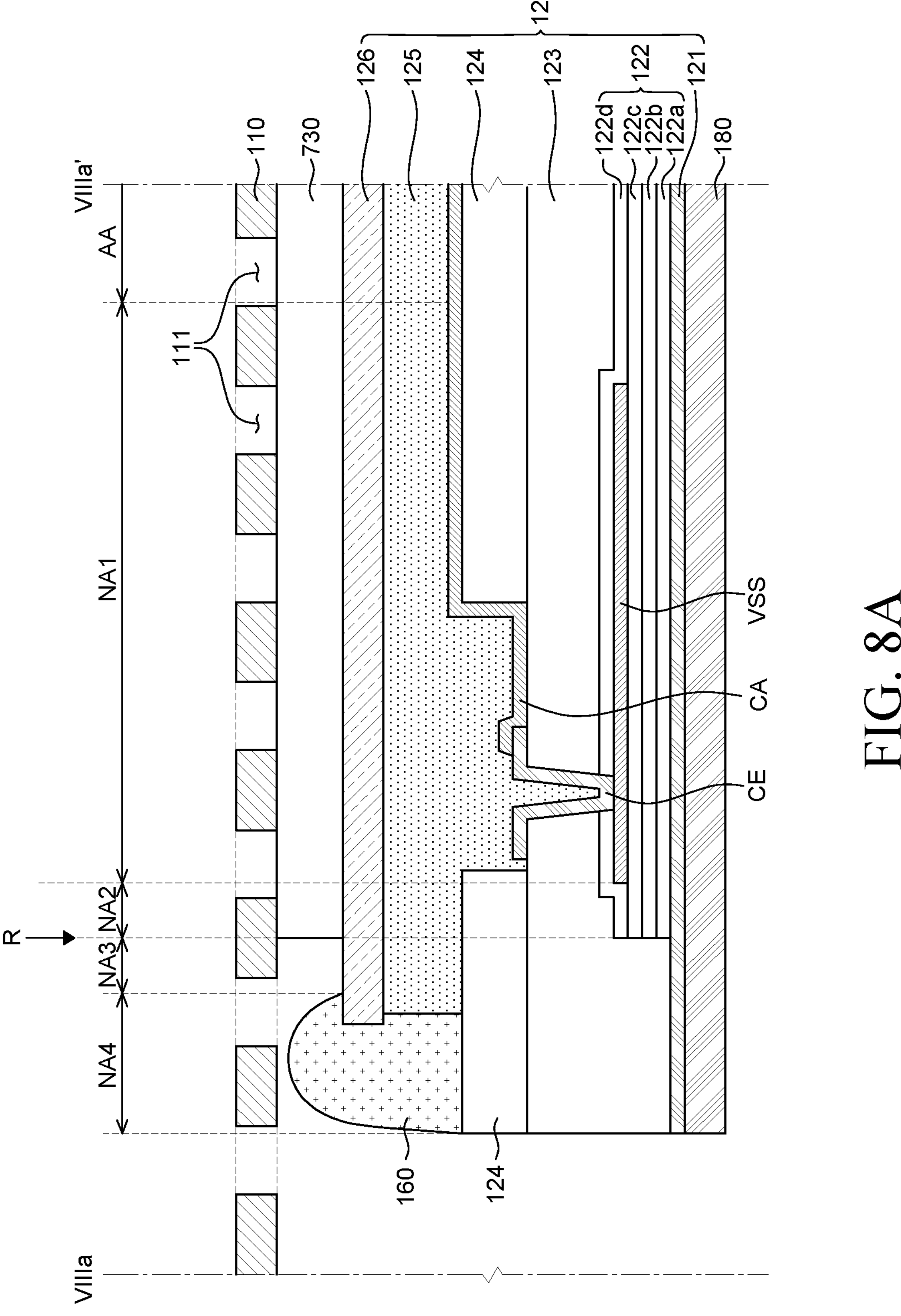
FIG. 8A is a cross-sectional view taken along a line VIIIa-VIIIa' of FIG. 7 according to an exemplary embodiment of the present disclosure.
Figure 8B:
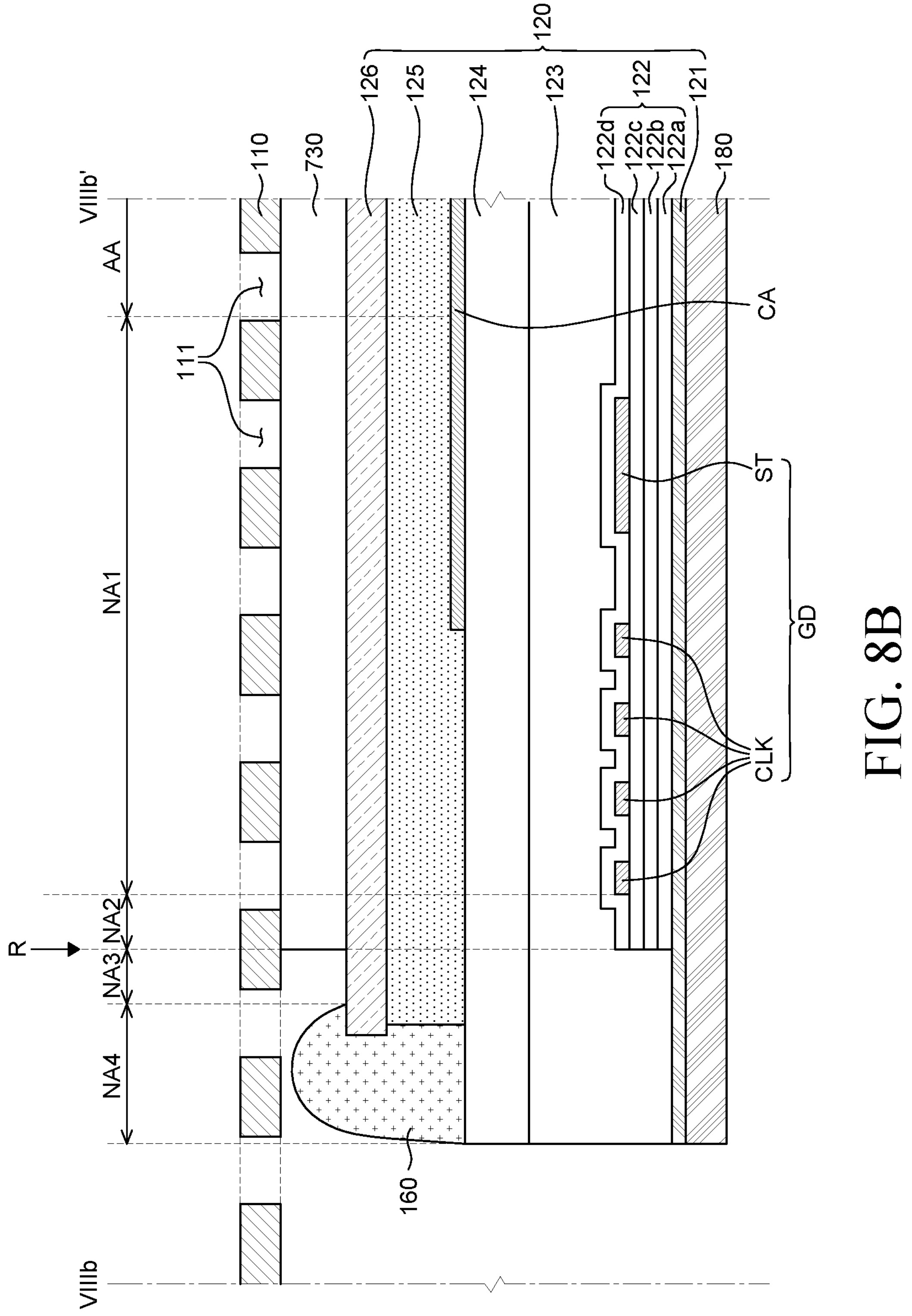
FIG. 8B is a cross-sectional view taken along a line VIIIb-VIIIb' of FIG. 7 according to an exemplary embodiment of the present disclosure.
Figure 8C:
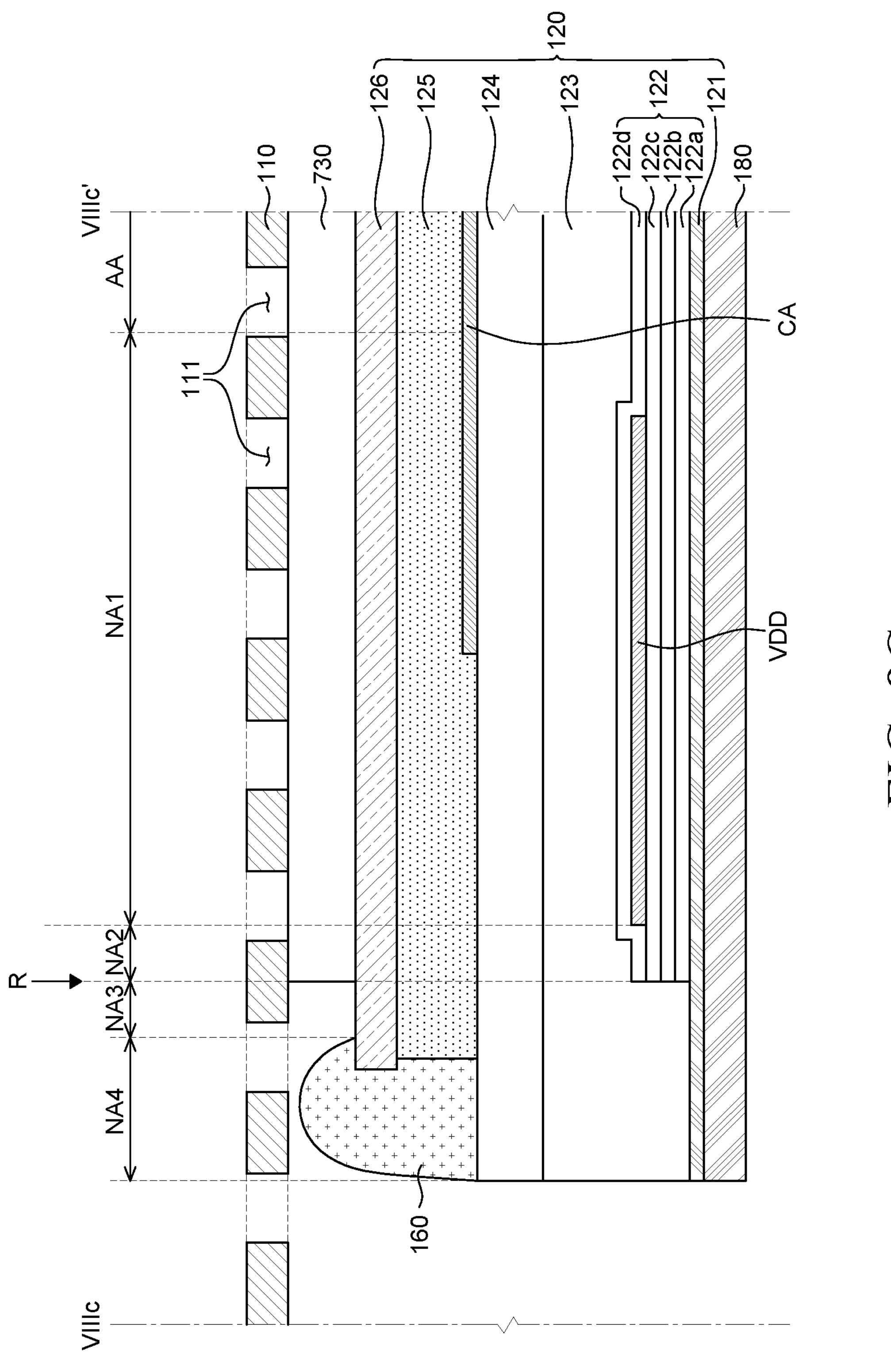
FIG. 8C is a cross-sectional view taken along a line VIIIc-VIIIc' of FIG. 7 according to an exemplary embodiment of the present disclosure.

FIG. 7 is a plan view of a display device according to another exemplary embodiment of the present disclosure. FIG. 8A is a cross-sectional view taken along the line VIIIa'VIIIa' of FIG. 7 according to an exemplary embodiment of the present disclosure. FIG. 8B is a cross-sectional view taken along the line VIIIb'VIIIb' of FIG. 7 according to an exemplary embodiment of the present disclosure. FIG. 8C is a cross-sectional view taken along the line VIIIc-VIIIc' of FIG. 7 according to an exemplary embodiment of the present disclosure. The only difference between a display device 700 of FIGS. 7 to 8C and the display device 100 of FIGS. 1 to 6C is an adhesive layer 730, but other configurations are substantially the same, so that a redundant description will be omitted.

Referring to FIGS. 7 to 8C, in the display device 700 according to another exemplary embodiment of the present disclosure, the adhesive layer 730 for bonding the display panel 120 and the back cover 110 is disposed to be spaced apart from the seal member 160 and an end of the adhesive layer 730 may be disposed so as to align with an end of the inorganic layer 122. That is, the end of the adhesive layer 730 may be located in accordance with the reference line R of the non-active area NA and the end of the adhesive layer 730 may overlap the end of the inorganic layer 122. Therefore, the adhesive layer 730 of the display device 700 according to another exemplary embodiment of the present disclosure fully covers the inorganic layer 122 to fully overlap.

In the display device 700 according to another exemplary embodiment of the present disclosure, the adhesive layer 730 which bonds the display panel 120 and the back cover 110 in an area other than an area connected to the display panel 120 and the plurality of flexible films 140 is disposed to be spaced apart from the seal member 160. The end of the adhesive layer 730 may be disposed to correspondingly overlap the end of the inorganic layer 122. Accordingly, in the display device 700 according to another exemplary embodiment of the present disclosure, the adhesive layer 730 which bonds the display panel 120 and the back cover 120 is disposed to be spaced apart from the seal member 160 with a predetermined distance. Therefore, the bubbles generated due to the step difference between the seal member 160 and the second substrate 126 are blocked to reduce the crack generated due to the bubbles.

Further, in the display device 700 according to the exemplary embodiment of the present disclosure, the adhesive layer 730 is disposed to be spaced apart from the seal member 160. In this case, the adhesive layer 730 covers the conductive material disposed in the inorganic layer 122, that is, ends of the low potential power line VSS, the gate driver GD, and the high potential power line VDD so that the end of the adhesive layer 730 is located over the end of the conductive material. Therefore, the crack generated in the wiring line formed by the conductive material may be reduced.

Further, in the display device 700 according to another exemplary embodiment of the present disclosure, an end of the adhesive layer 730 may be disposed to correspondingly overlap the end of the inorganic layer 122. Therefore, the adhesive layer 730 is disposed to fully cover the inorganic layer 122 so that the stress applied to the inorganic layer 122 is absorbed by the adhesive layer 730 so that the crack of the inorganic layer 122 may be reduced.

Figure 9:
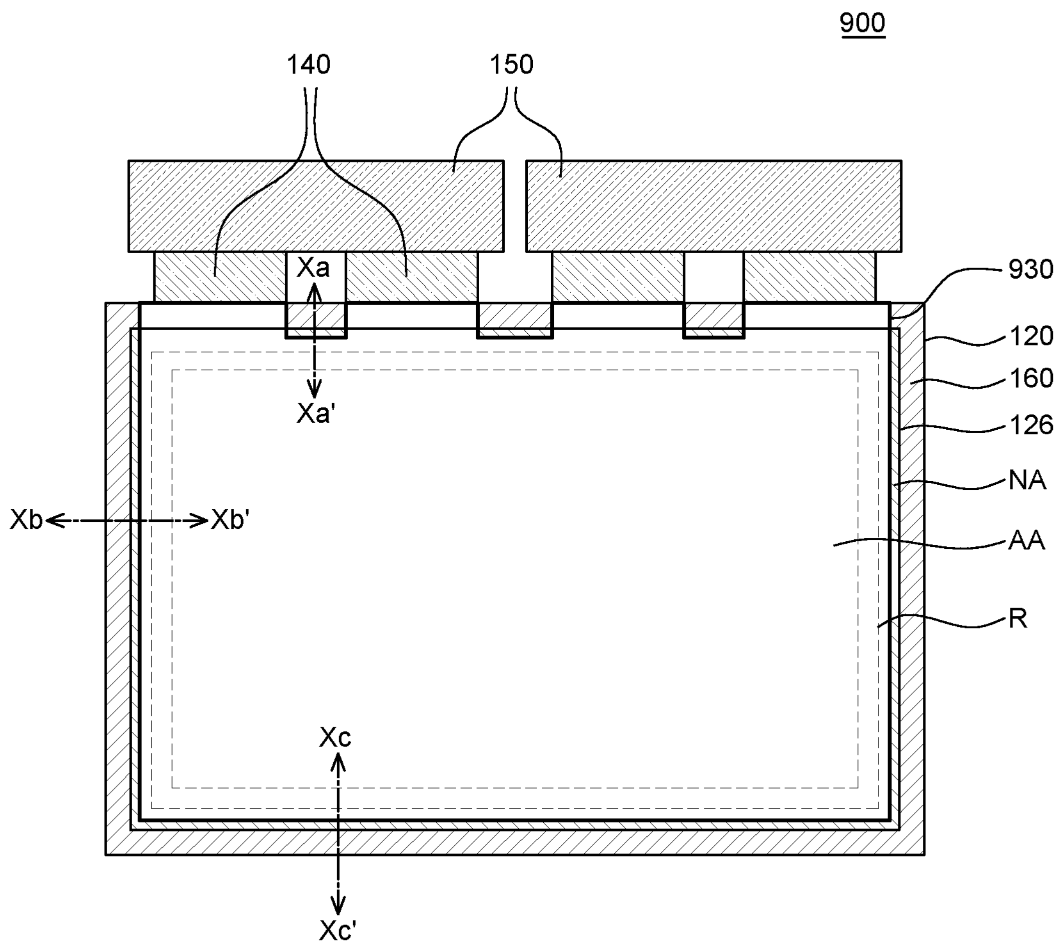
FIG. 9 is a plan view of a display device according to still another exemplary embodiment of the present disclosure.
Figure 10A:
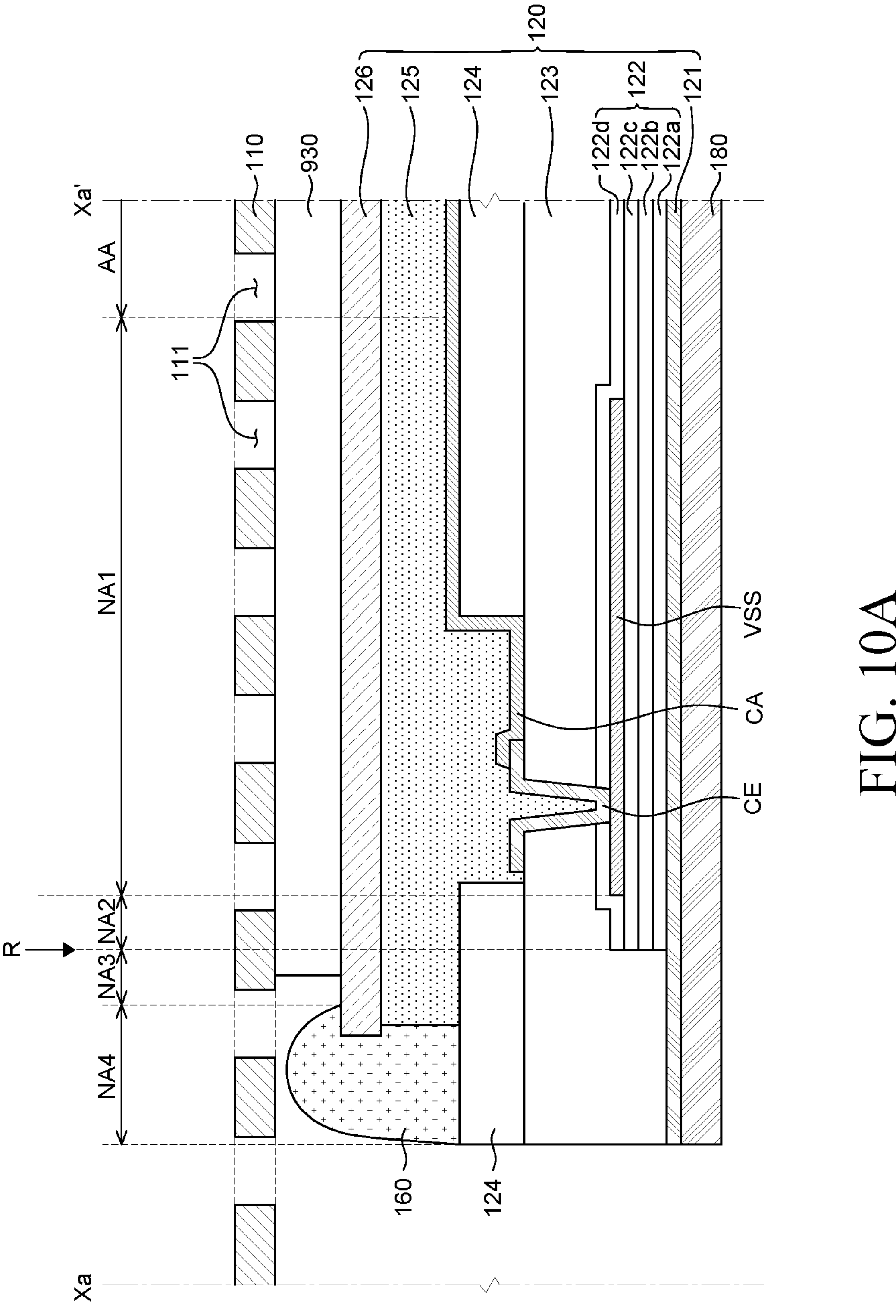
FIG. 10A is a cross-sectional view taken along a line Xa-Xa' of FIG. 9 according to an exemplary embodiment of the present disclosure.
Figure 10B:
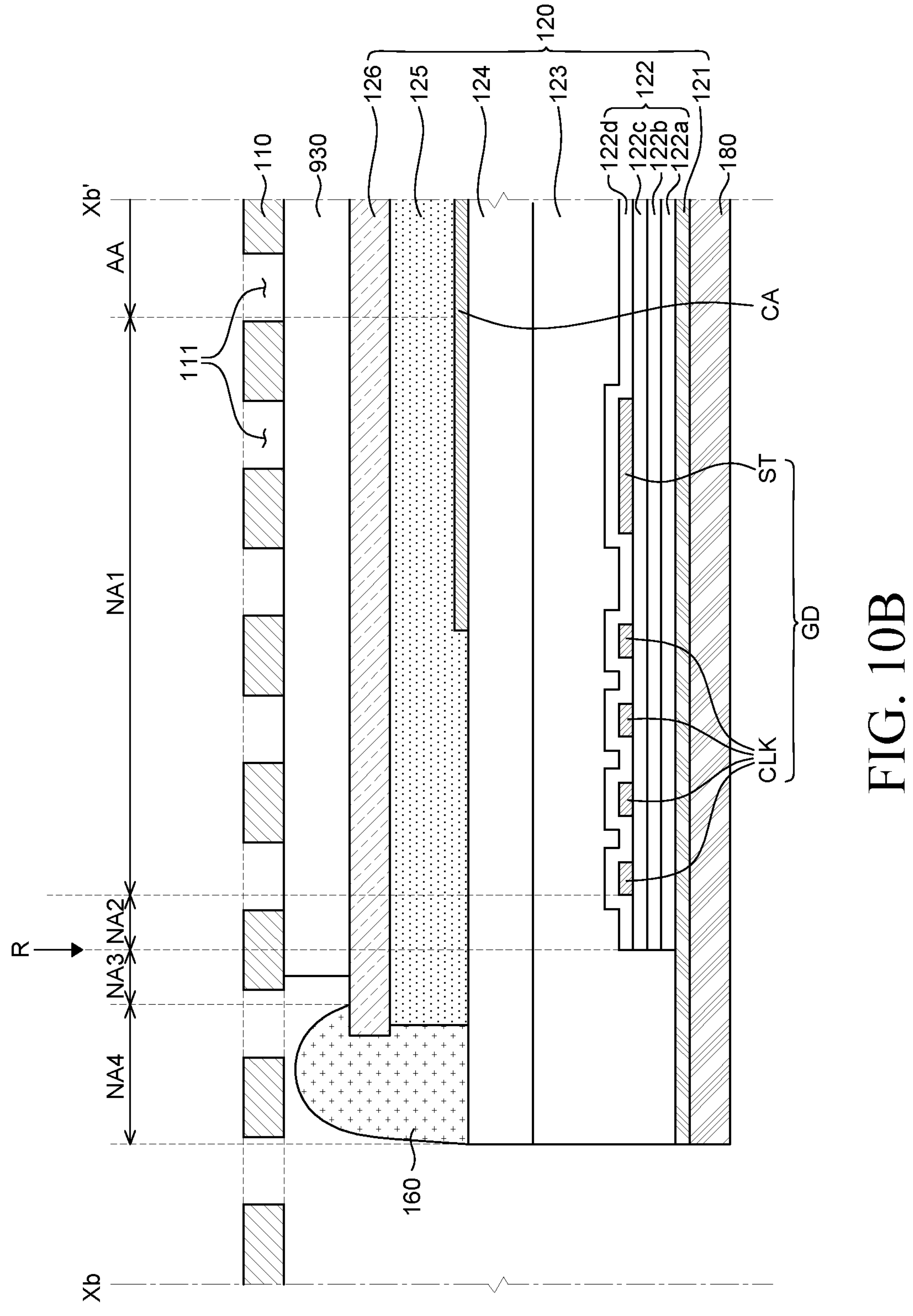
FIG. 10B is a cross-sectional view of a display device taken along a line Xb-Xb' of FIG. 9 according to an exemplary embodiment of the present disclosure.
Figure 10C:
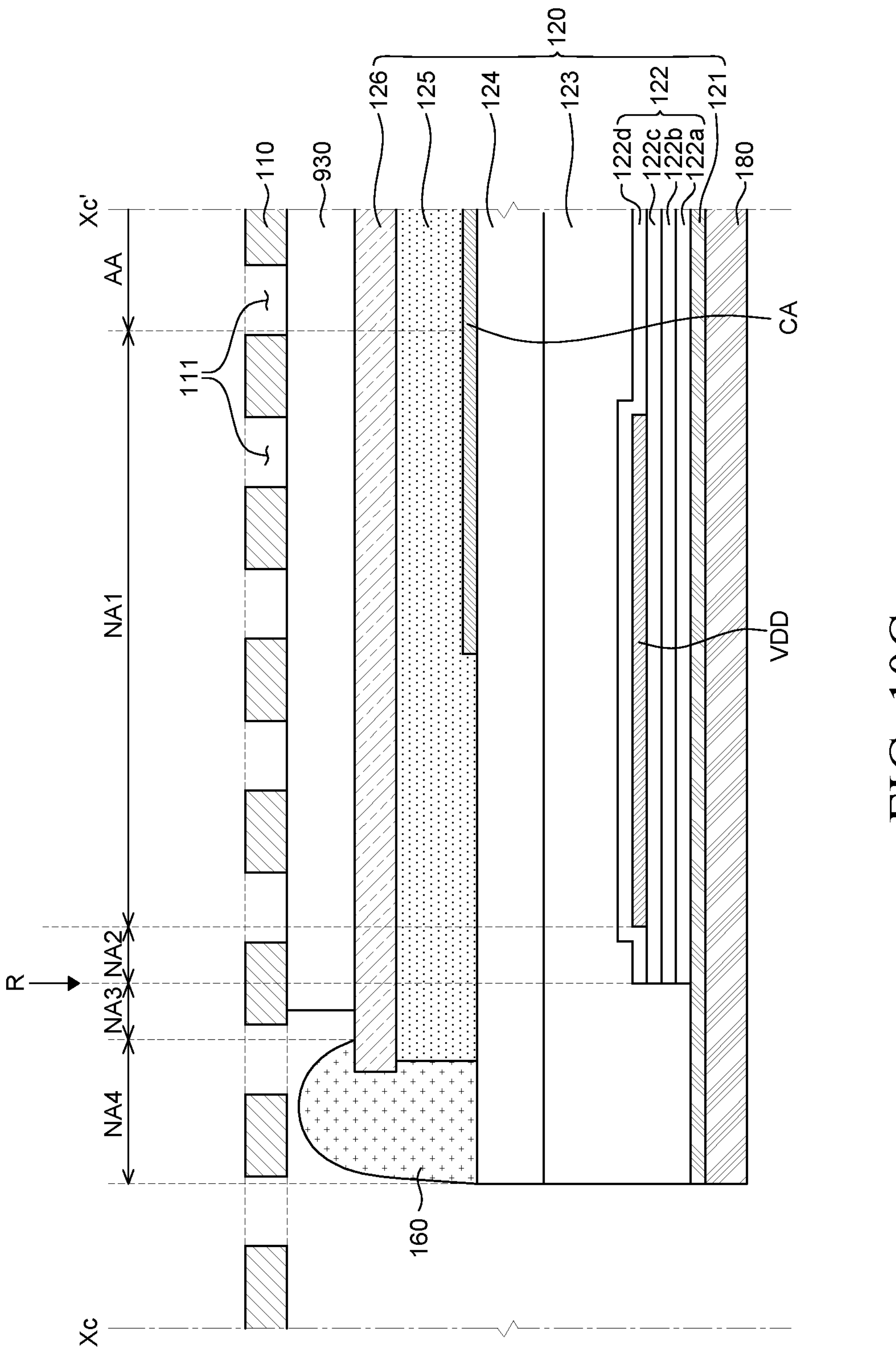
FIG. 10C is a cross-sectional view taken along a line Xc-Xc' of FIG. 9 according to an exemplary embodiment of the present disclosure.

FIG. 9 is a plan view of a display device according to still another exemplary embodiment of the present disclosure. FIG. 10A is a cross-sectional view taken along the line Xa-Xa' of FIG. 9 according to an exemplary embodiment of the present disclosure. FIG. 10B is a cross-sectional view of a display device taken along the line Xb-Xb' of FIG. 9 according to an exemplary embodiment of the present disclosure. FIG. 10C is a cross-sectional view taken along the line Xc-Xc' of FIG. 9 according to an exemplary embodiment of the present disclosure. The only difference between a display device 900 of FIGS. 9 to 10C and the display device 100 of FIGS. 1 to 6C is an adhesive layer 930, but other configurations are substantially the same, so that a redundant description will be omitted.

Referring to FIGS. 9 to 10C, in the display device 900 according to another exemplary embodiment of the present disclosure, the adhesive layer 930 for bonding the display panel 120 and the back cover 110 is disposed to be spaced apart from the seal member 160 and an end of the adhesive layer 930 may be disposed in the third non-active area NA3. An end of the adhesive layer 930 is spaced apart from the seal member 160 and an end of the inorganic layer 122 may be located at the outside of the reference line R.

In the display device 900 according to still another exemplary embodiment of the present disclosure, the adhesive layer 930 which bonds the display panel 120 and the back cover 110 other than an area connected to the display panel 120 and the plurality of flexible films 140 is disposed to be spaced apart from the seal member 160. The end of the adhesive layer 930 may be disposed in the third non-active area NA3. Accordingly, in the display device 900 according to still another exemplary embodiment of the present disclosure, the adhesive layer 930 which bonds the display panel 120 and the back cover 120 is disposed to be spaced apart from the seal member 160 with a predetermined distance. Therefore, the bubbles generated due to the step difference between the seal member 160 and the second substrate 126 are blocked to reduce the crack generated due to the bubbles.

Further, in the display device 900 according to still another exemplary embodiment of the present disclosure, the adhesive layer 930 is disposed to be spaced apart from the seal member 160. In this case, the adhesive layer 930 covers the conductive material disposed in the inorganic layer 122, that is, ends of the low potential power line VSS, the gate driver GD, and the high potential power line VDD so that the end of the adhesive layer 930 is located over the end of the conductive material. Therefore, the crack generated in the wiring line formed by the conductive material may be minimized.

Further, in the display device 900 according to still another exemplary embodiment of the present disclosure, an end of the adhesive layer 930 may be disposed to cover the end of the inorganic layer 122 and protrude past the end of the inorganic layer 122. Therefore, the adhesive layer 930 is disposed to fully cover the inorganic layer 122 so that the stress applied to the inorganic layer 122 is absorbed by the adhesive layer 930 so that the crack of the inorganic layer 122 may be reduced.

The exemplary embodiments of the present disclosure can also be described as follows:

According to an aspect of the present disclosure, a display device, comprising: a first substrate which includes an active area including a plurality of sub pixels and a non-active area enclosing the active area and is formed of one of transparent conducting oxide and an oxide semiconductor; an inorganic layer disposed on the first substrate; a planarization layer disposed on the inorganic layer; a second substrate which is disposed on the planarization layer and has an end thereof located at the inside of the first substrate; a seal member disposed so as to cover a part of an upper portion of the second substrate; an adhesive layer which is spaced apart from the seal member to be disposed on the second substrate; and a back cover which is disposed on the adhesive layer and is bonded to the second substrate by the adhesive layer.

An end of the inorganic layer may be located at the inside of the end of the first substrate in the non-active area.

The inorganic layer is configured by a plurality of layers formed of an inorganic material and at least one of a high potential power line, a low potential power line, and a gate driver may be disposed on at least one layer among the plurality of layers in the non-active area.

An end of the adhesive layer may be located between the end of the inorganic layer and an end of any one of the high potential power line, the low potential power line, and the gate driver.

An end of the adhesive layer may be located to overlap the end of the inorganic layer.

An end of the adhesive layer may be located between the seal member and the end of the inorganic layer.

The planarization layer covers the end of the inorganic layer and may be disposed on the entire surface of the first substrate.

The adhesive layer may be a double-sided tape.

The display device may further comprising: a plurality of flexible films disposed at one end of the first substrate, the adhesive layer is spaced apart from the seal member in an area other than an area in which the plurality of flexible films is disposed.

The adhesive layer may be disposed on the seal member in an area in which the plurality of flexible films is disposed.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a first substrate including an active area having a plurality of sub pixels in the active area and a non-active area enclosing the active area, the first substrate comprising one of a transparent conducting oxide or an oxide semiconductor;

an inorganic layer on the first substrate;

a planarization layer on the inorganic layer;

a second substrate on the planarization layer, the second substrate including an end that is inset from an end of the first substrate such that the end of the first substrate extends past the end of the second substrate;

a seal member covering a portion of the second substrate;

an adhesive layer on the second substrate, the adhesive layer extending short of the seal member without having a physical contact with the seal member in the non-active area; and a back cover on the adhesive layer, the back cover bonded to the second substrate by the adhesive layer.

2. The display device according to claim 1, wherein an end of the inorganic layer is inset from the end of the first substrate in the non-active area.

3. The display device according to claim 2, wherein the inorganic layer comprises a plurality of inorganic layers and at least one of a high potential power line, a low potential power line, and a gate driver is on at least one inorganic layer among the plurality of inorganic layers in the non-active area.

4. The display device according to claim 3, wherein an end of the adhesive layer extends past an end of any one of the high potential power line, the low potential power line, and the gate driver and is inset from the end of the inorganic layer.

5. The display device according to claim 3, wherein an end of the adhesive layer is aligned with the end of the inorganic layer.

6. The display device according to claim 3, wherein an end of the adhesive layer extends past the end of the inorganic layer without extending to the seal member.

7. The display device according to claim 2, wherein the planarization layer overlaps the end of the inorganic layer and is on an entire surface of the first substrate.

8. The display device according to claim 1, wherein the adhesive layer comprises double-sided tape.

9. The display device according to claim 1, further comprising:

a plurality of flexible films at one end of the first substrate, wherein the adhesive layer is spaced apart from the seal member in an area other than an area comprising the plurality of flexible films.

10. The display device according to claim 9, wherein the adhesive layer is on the seal member in the area comprising the plurality of flexible films.

11. A display device comprising:

a first substrate comprising an active area and a non-active area around the active area;

an inorganic layer on the active area and the non-active area of the first substrate, wherein an end of the inorganic layer is inset from an end of the first substrate in the non-active area;

a plurality of subpixels on a portion of the inorganic layer in the active area, the plurality of subpixels configured to emit light;

a second substrate on the plurality of subpixels, the second substrate including an end that is inset from the end of the first substrate in the non-active area such that the end of the first substrate extends past the end of the second substrate in the non-active area;

a seal member in the non-active area, the seal member covering an edge of an uppermost surface of the second substrate in the non-active area such that an uppermost portion of the seal member is higher than the uppermost surface of the second substrate;

a back cover on the second substrate; and an adhesive layer between the second substrate and the back cover, an end of the adhesive layer spaced apart from the seal member in the non-active area.

12. The display device of claim 11, wherein the first substrate comprises one of a transparent conducting oxide or an oxide semiconductor.

13. The display device of claim 11, further comprising:

a conductive element on the inorganic layer in the non-active area, wherein an end of the adhesive layer extends past an end of the conductive element and is inset from an end of the inorganic layer.

14. The display device of claim 11, further comprising:

a conductive element on the inorganic layer in the non-active area, wherein an end of the adhesive layer extends past an end of the conductive element and is aligned with an end of the inorganic layer.

15. The display device of claim 11, further comprising:

a conductive element on the inorganic layer in the non-active area, wherein an end of the adhesive layer extends past an end of the inorganic layer and an end of the conductive element without extending to the seal member.

* * * * *